(12) United States Patent
Nagamine et al.

(10) Patent No.: US 11,199,650 B2
(45) Date of Patent: Dec. 14, 2021

(54) LENS UNIT, EXPOSURE DEVICE, READING HEAD, IMAGE FORMING APPARATUS, AND IMAGE READING APPARATUS

(71) Applicant: OKI ELECTRIC INDUSTRY CO., LTD., Tokyo (JP)

(72) Inventors: Masamitsu Nagamine, Tokyo (JP); Ren Nakamichi, Tokyo (JP); Akihiro Yamamura, Tokyo (JP)

(73) Assignee: OKI ELECTRIC INDUSTRY CO., LTD., Tokyo (JP)

( * ) Notice: Subject to any disclaimer, the term of this patent is extended or adjusted under 35 U.S.C. 154(b) by 11 days.

(21) Appl. No.: 16/788,521

(22) Filed: Feb. 12, 2020

(65) Prior Publication Data

US 2020/0292732 A1    Sep. 17, 2020

(30) Foreign Application Priority Data

Mar. 14, 2019    (JP) .............................. JP2019-046719

(51) Int. Cl.
*G02B 3/00*    (2006.01)
*G03G 15/04*    (2006.01)
(Continued)

(52) U.S. Cl.
CPC .............. *G02B 3/0056* (2013.01); *B41J 11/46* (2013.01); *G02B 3/0031* (2013.01); *G03B 27/523* (2013.01); *G03B 27/528* (2013.01); *G03G 15/00* (2013.01); *G03G 15/04* (2013.01); *G03G 15/04036* (2013.01); *G03G 15/0865* (2013.01); *G03G 15/0868* (2013.01);
(Continued)

(58) Field of Classification Search
CPC ...... G03G 15/04; G02B 3/0056; G02B 27/18; H01L 47/00
USPC ......................................................... 399/218
See application file for complete search history.

(56) References Cited

U.S. PATENT DOCUMENTS 5,444,520 A * 8/1995 Murano ................... B41J 2/465
347/244
7,764,429 B2 * 7/2010 Nomura ................... B41J 2/451
359/621
(Continued)

FOREIGN PATENT DOCUMENTS

JP    2013015847    *    1/2013 ............... G02B 3/00
JP    2013015847 A        1/2013

*Primary Examiner* — Clayton E. LaBalle
*Assistant Examiner* — Kevin C Butler
(74) *Attorney, Agent, or Firm* — Panitch Schwarze Belisario & Nadel LLP

(57) ABSTRACT

The lens unit includes a first lens array including a plurality of first lens elements each of which has a first optical axis and which are arranged in an arrangement direction perpendicular to the first optical axis. A second lens array includes a plurality of second lens elements each of which has a second optical axis and which are arranged in the arrangement direction while facing the first lens elements. The second lens array is in a positional relationship relative to the first lens array such that the second lens array is rotated about a virtual line perpendicular to both the first optical axis and the arrangement direction as the rotational axis by 180 degrees. The optical axes of the lens elements located at the substantially centers of the lens arrays in the arrangement direction are arranged to substantially coincide with each other.

17 Claims, 21 Drawing Sheets

(51) Int. Cl.

| | | |
|---|---|---|
| *G03G 21/18* | (2006.01) | |
| *B41J 11/46* | (2006.01) | |
| *G03G 15/00* | (2006.01) | |
| *G03B 27/52* | (2006.01) | |
| *G03G 21/16* | (2006.01) | |
| *H01L 47/00* | (2006.01) | |
| *G03G 15/08* | (2006.01) | |

(52) U.S. Cl.
CPC ..... *G03G 15/0872* (2013.01); *G03G 21/1633* (2013.01); *G03G 21/1666* (2013.01); *G03G 21/1853* (2013.01); *H01L 47/00* (2013.01); *G03G 2215/0668* (2013.01); *G03G 2215/0692* (2013.01)

(56) References Cited

U.S. PATENT DOCUMENTS

| | | | | |
|---|---|---|---|---|
| 7,898,738 B2* | 3/2011 | Yamamura | ....... | B29D 11/00278 359/622 |
| 8,000,015 B2* | 8/2011 | Yamamura | ........... | G02B 3/0006 359/622 |
| 8,274,741 B2* | 9/2012 | Koizumi | ................ | G02B 5/001 359/619 |
| 2008/0166155 A1* | 7/2008 | Funamoto | ........ | G03G 15/04072 399/218 |
| 2009/0035020 A1* | 2/2009 | Sowa | .................... | H04N 1/1935 399/218 |
| 2009/0060579 A1* | 3/2009 | Nomura | .......... | G03G 15/04045 399/218 |
| 2009/0185828 A1* | 7/2009 | Koizumi | .............. | G02B 3/0081 399/218 |
| 2009/0185829 A1* | 7/2009 | Nomura | ..................... | B41J 2/45 399/218 |
| 2010/0034562 A1* | 2/2010 | Nomura | ............... | G02B 3/0056 399/218 |
| 2010/0046080 A1* | 2/2010 | Nomura | ............... | G02B 3/0068 359/619 |
| 2010/0183336 A1* | 7/2010 | Sowa | ............... | G03G 15/04072 399/218 |
| 2010/0202800 A1* | 8/2010 | Sowa | ............... | G03G 15/04045 399/218 |
| 2011/0116819 A1* | 5/2011 | Matsuoka | ........ | G03G 15/04072 399/51 |
| 2011/0280628 A1* | 11/2011 | Kim | ....................... | G02B 5/003 399/218 |
| 2013/0135694 A1* | 5/2013 | Yamamura | ........... | H04N 1/1017 358/474 |
| 2014/0160573 A1* | 6/2014 | Teramura | ........... | G02B 3/0062 359/619 |
| 2015/0268386 A1* | 9/2015 | Miyajima | .............. | H04N 1/192 358/474 |
| 2015/0293468 A1* | 10/2015 | Morita | ............ | G03G 15/04036 399/218 |

* cited by examiner

FIG. 8A
FIG. 8B
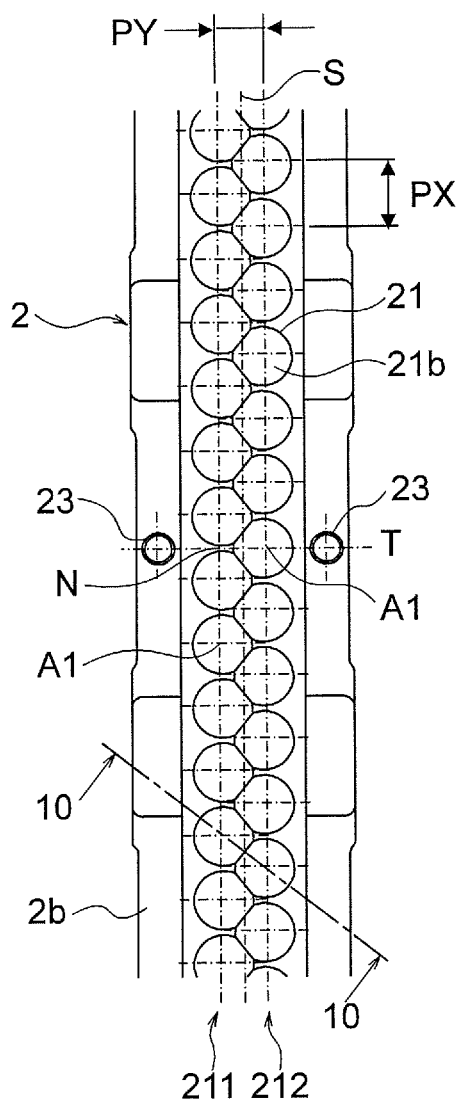
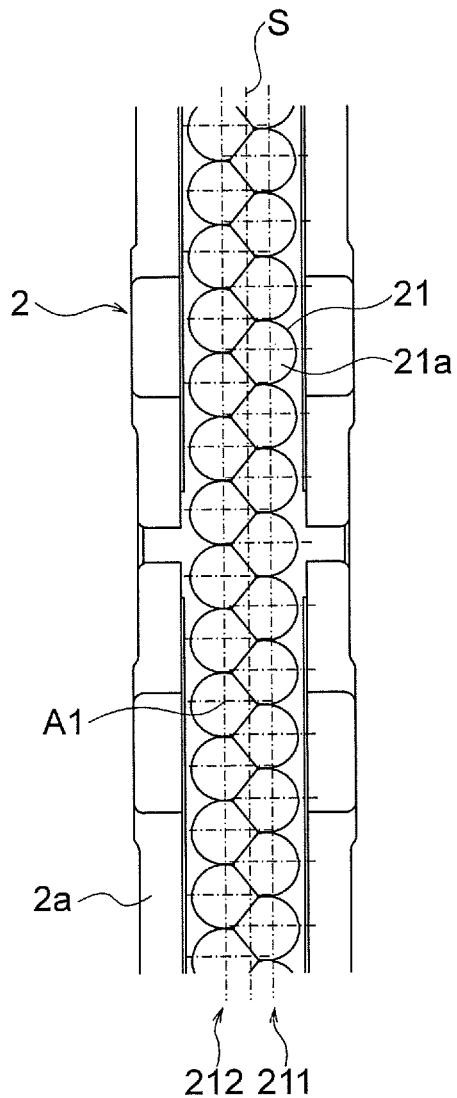

FIG. 9A
FIG. 9B
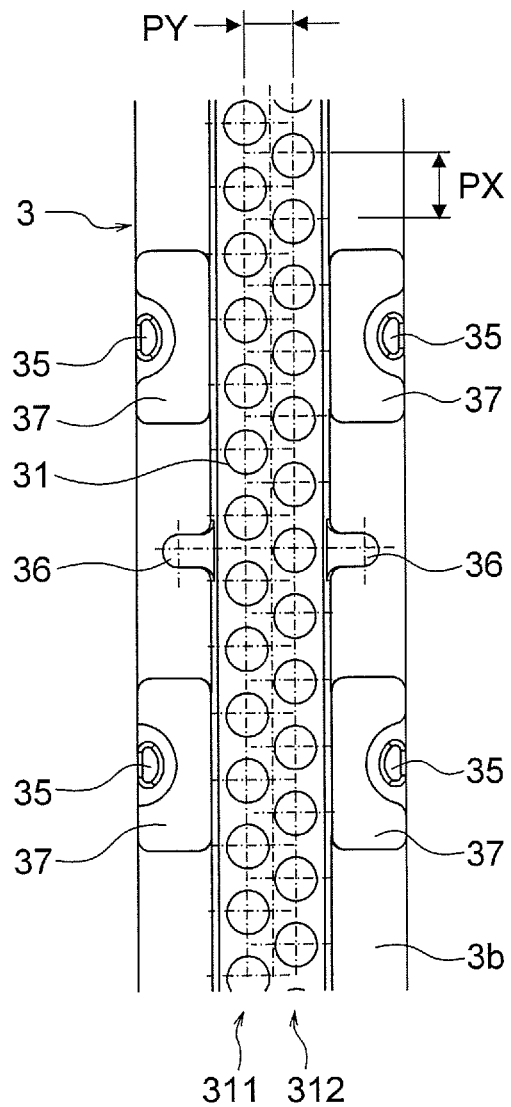
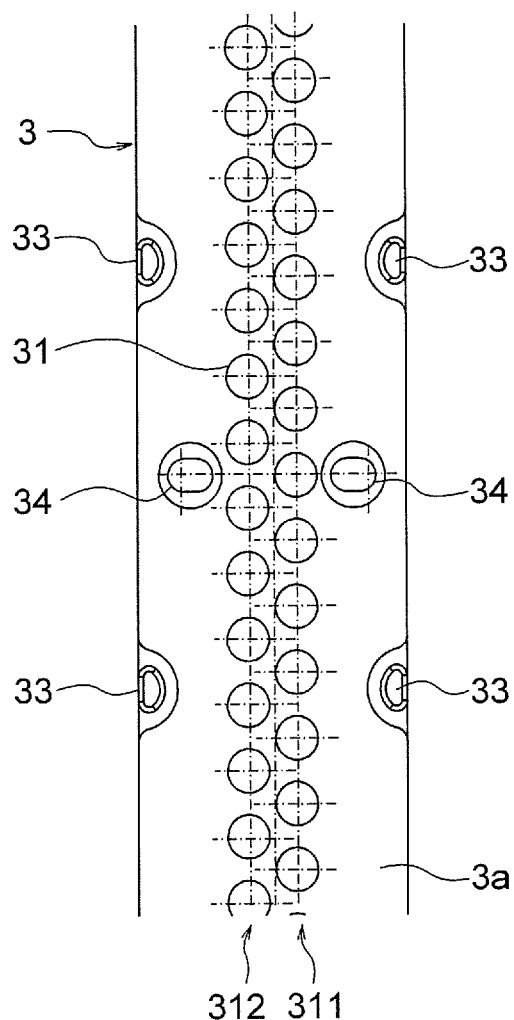
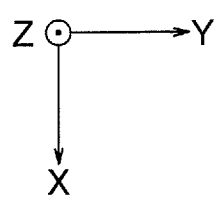
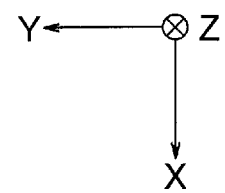

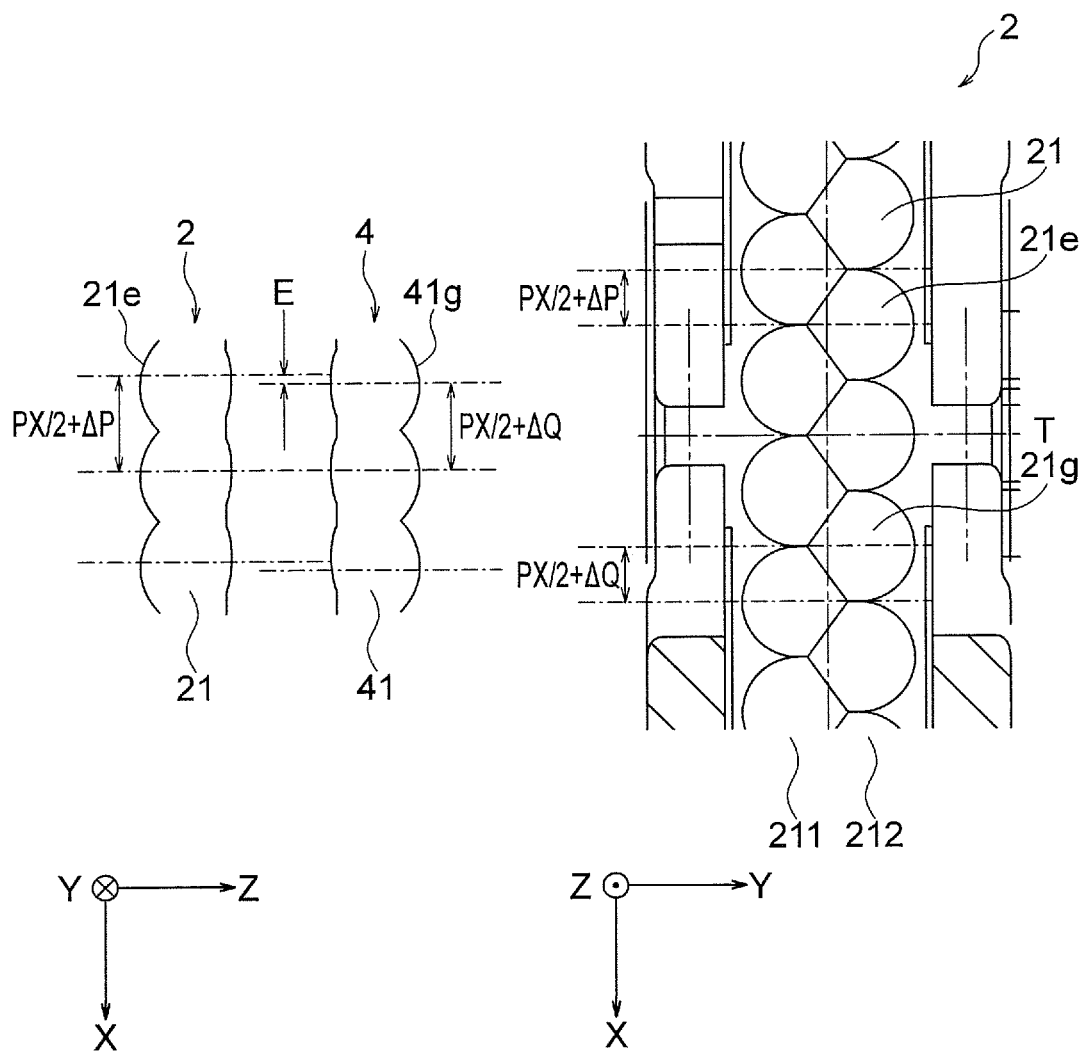

LENS UNIT, EXPOSURE DEVICE, READING HEAD, IMAGE FORMING APPARATUS, AND IMAGE READING APPARATUS

CROSS-REFERENCE TO RELATED APPLICATION

This application claims priority under 35 U.S.C. § 119(b) to Japanese Application No. 2019-046719, filed Mar. 14, 2019, the disclosure of which is incorporated by reference herein in its entirety.

1. BACKGROUND OF THE INVENTION

The present invention relates to a lens unit, an exposure device, a reading head, an image forming apparatus, and an image reading apparatus.

2. DESCRIPTION OF THE RELATED ART

An exposure device of an image forming apparatus has a lens unit that includes a first lens array and a second lens array. Each lens array has lens elements arranged in one direction. A light shielding member is disposed between the first and second lens arrays. The lens elements in the first lens array and the lens elements in the second lens array are arranged in such a manner that their optical axes coincide with each other.

In the lens unit disclosed in, for example, Japanese Patent Application Publication No. 2013-15847 (see claim 1), the second lens array is located at a position such that the second lens array is rotated relative to the first lens array about a virtual line parallel to an arrangement direction of the lens elements as a rotational axis.

SUMMARY OF THE INVENTION

However, if there is a variation in the arrangement interval of the lens elements in each lens array, the optical axes of the lens elements in the first lens array may be deviated from the optical axes of the lens elements in the second lens array. In such a case, a resolution of the image forming apparatus may be reduced.

The present invention is made to solve the above described problems, and an object of the present invention is to reduce a deviation of optical axes of lens elements, thereby enhancing a resolution.

According to an aspect of the present invention, there is provided a lens unit including a first lens array including a plurality of first lens elements each of which has a first optical axis and which are arranged in an arrangement direction perpendicular to the first optical axis. The lens unit further includes a second lens array including a plurality of second lens elements each of which has a second optical axis and which are arranged in the arrangement direction so as to face the first lens elements. The second lens array is in a positional relationship relative to the first lens array such that the second lens array is rotated about a virtual line perpendicular to both the first optical axis and the arrangement direction as a rotational axis by 180 degrees. The first optical axis of the first lens element located at a substantially center of the first lens array in the arrangement direction and the second optical axis of the second lens element located at a substantially center of the second lens array in the arrangement direction are arranged to substantially coincide with each other.

According to another aspect of the present invention, there is provided an exposure device including the lens unit described above and a light emitting element disposed to face the lens unit. According to still another aspect of the present invention, there is provided an image forming apparatus including the exposure device described above, an image bearing body disposed to face the exposure device, a developing portion that develops a latent image formed by the exposure device on the image bearing body, and a transfer portion that transfers an image developed by the developing portion to a medium.

According to a further aspect of the present invention, there is provided a reading head including the lens unit described above, and a light receiving element disposed to face the lens unit. According to a still further aspect of the present invention, there is provided an image reading apparatus including the reading head described above and a support table that holds a reading object at a position at which the reading object faces the reading head.

With the above described configuration, the second lens array is in a positional relationship relative to the first lens array such that the second lens array is rotated about the virtual line perpendicular to both the first optical axis and the arrangement direction as the rotational axis. Further, the optical axes of the lens elements located at the substantially centers of the first and second lens arrays in the arrangement direction are arranged to substantially coincide with each other. Thus, even when there is a variation in the arrangement interval of the lens elements, a deviation of the optical axes can be reduced, and a resolution can be enhanced.

BRIEF DESCRIPTION OF THE DRAWINGS

In the attached drawings:

FIG. 8A is a plan view showing a first lens array of Embodiment 1;

FIG. 8B is a rear view showing the first lens array of Embodiment 1;

FIG. 9A is a plan view showing a second lens array of Embodiment 1;

FIG. 9B is a rear view showing the second lens array of Embodiment 1;

FIGS. 12A and 12B are schematic diagrams for explaining a deviation of optical axes in the lens unit of Embodiment 1;

DETAILED DESCRIPTION OF THE INVENTION

Embodiment 1

Configuration of Image Forming Apparatus

Figure 1:
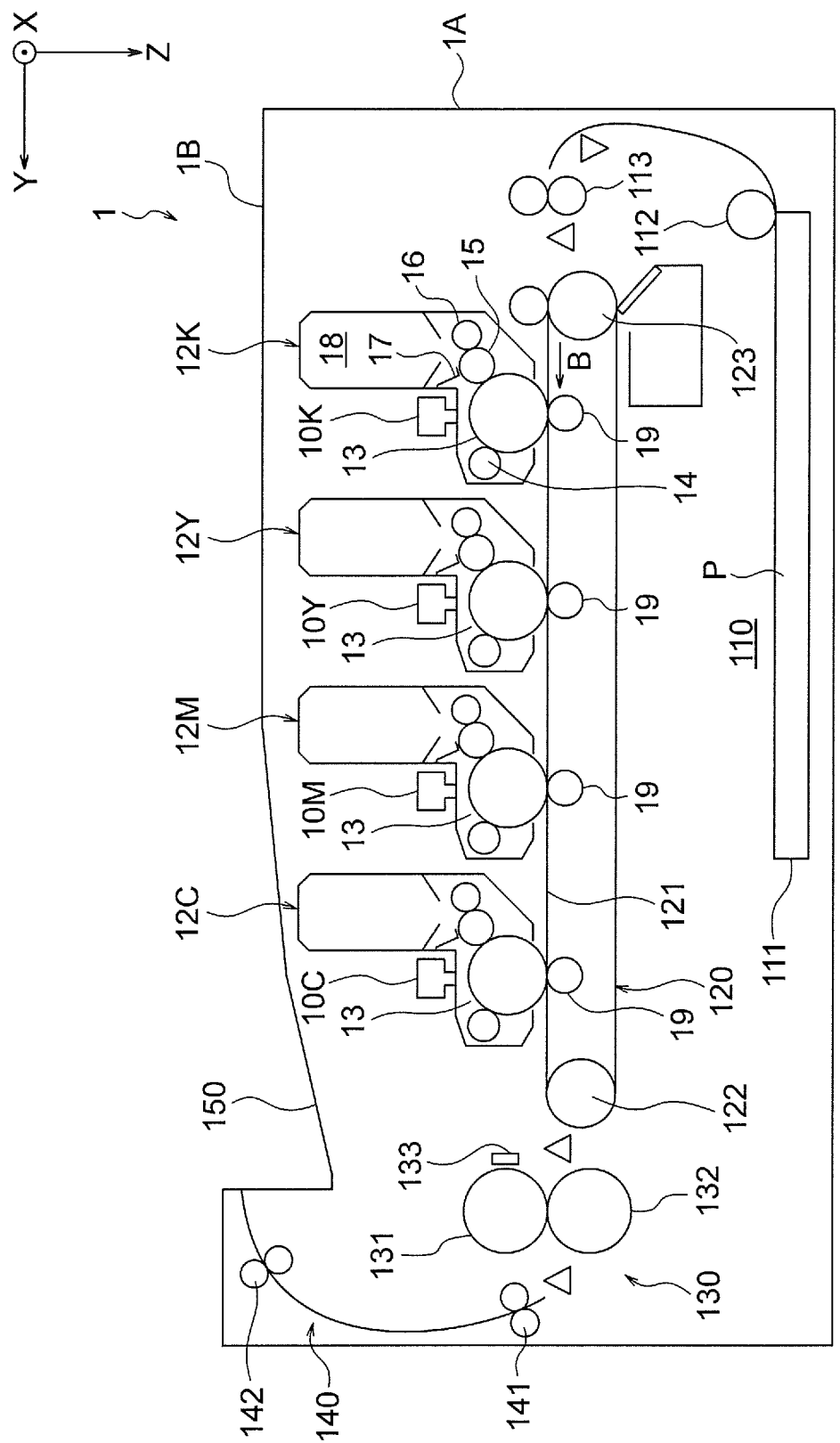
FIG. 1 is a diagram showing an entire configuration of an image forming apparatus of Embodiment 1.

FIG. 1 is a diagram showing a configuration of an image forming apparatus of Embodiment 1. An image forming apparatus 1 shown in FIG. 1 is configured to form images using an electrophotography, and is, for example, a color printer.

The image forming apparatus 1 includes process units 12K, 12Y, 12M, and 12C serving as image forming portions that form toner images in black (K), yellow (Y), magenta (M), and cyan (C), respectively. The image forming apparatus 1 also includes a medium supply portion 110 that supplies a medium P such as a printing sheet to the process units 12K, 12Y, 12M, and 12C. The image forming apparatus 1 further includes a transfer unit 120 that transfers a toner image to the medium P, a fixing device 130 that fixes the toner image to the medium P, and a medium ejection portion 140 that ejects the medium P with the toner image fixed thereto.

The medium supply portion 110 includes a sheet cassette 111 that stores the medium P. The medium supply portion 110 also includes a feed roller 112 that feeds the medium P from the sheet cassette 111 one by one. The medium supply portion 110 further includes a pair of conveying rollers 113 that convey the medium P fed by the feed roller 112 toward the process units 12K, 12Y, 12M, and 12C. The medium P is not limited to a printing sheet. The medium P may be an OHP sheet, an envelope, a copying sheet, a special sheet, or the like.

The process units 12K, 12Y, 12M, and 12C are arranged from upstream to downstream (from right to left in this example) along a conveying path for the medium P. The process units 12K, 12Y, 12M, and 12C have the same configuration except for the toner, and thus are hereinafter collectively referred to as the "process unit 12" when there is no particular need to distinguish them.

The process unit 12 includes a cylindrical photosensitive drum 13 as an image bearing body and a charging roller 14 as a charging member that electrically charges a surface of the photosensitive drum 13 uniformly. The process unit 12 also includes a developing roller 15 as a developer bearing body that forms a toner image (developer image) by supplying a toner (developer) to an electrostatic latent image formed on the surface of the photosensitive drum 13.

The process unit 12 further includes a supply roller 16 as a supply member that supplies the toner to the developing roller 15, a developing blade 17 as a regulation member that regulates a thickness of a toner layer formed on a surface of the developing roller 15, and a toner cartridge 18 as a developer storing portion that supplies the toner to the supply roller 16.

Parts of the process unit 12 that include the developing roller 15, the supply roller 16, and the developing blade 17 constitute a developing portion. The toner cartridge 18 is detachably attached to the developing portion.

LED heads 10K, 10Y, 10M, and 10C as exposure devices are disposed to face the photosensitive drums 13 of the process units 12K, 12Y, 12M, and 12C, respectively. Each of the LED heads 10K, 10Y, 10M, and 10C emits light to expose the surface of the corresponding photosensitive drum 13 based on image data of each color to form an electrostatic latent image. The LED heads 10K, 10Y, 10M, and 10C have the same configuration, and thus are hereinafter collectively referred to as the "LED head 10" when there is no particular need to distinguish them.

The transfer unit 120 is disposed below the process units 12K, 12Y, 12M, and 12C. The transfer unit 120 includes a conveying belt 121 as a belt member that travels while adsorbing the medium P, a drive roller 122 that drives the conveying belt 121, and a tension roller 123 that applies tension to the conveying belt 121. The transfer unit 120 also includes four transfer rollers 19 as transfer members that face the respective photosensitive drums 13 via the conveying belt 121. The transfer roller 19 charges the medium P with an opposite polarity to the toner and transfers the toner images of respective colors from the photosensitive drums 13 to the medium P.

The fixing device 130 is disposed downstream of the transfer unit 120 in the conveying direction of the medium P. The fixing device 130 includes a fixing roller 131 and a pressure roller 132 that apply heat and pressure to the toner image on the medium P to thereby fix the toner image on the medium P. The fixing device 130 further includes a temperature sensor 133 that detects a surface temperature of the fixing roller 131.

The medium ejection portion 140 is disposed downstream of the fixing device 130. The medium ejection portion 140 includes two pairs of ejection rollers 141 and 142 that convey the medium P ejected from the fixing device 130 and eject the medium P from an ejection port of the medium ejection portion. A stacker portion 150 on which the medium P ejected by the ejection rollers 141 and 142 is placed is provided on an upper part of the image forming apparatus 1.

The image forming apparatus 1 includes a casing 1A that houses these components and an openable top cover 1B covering an upper part of the casing 1A. The LED heads 10K, 10Y, 10M, and 10C are supported by the top cover 1B in a suspended manner.

In the configuration described above, an X direction is defined as a direction of a rotational axis of each of the photosensitive drums 13 of the process units 12K, 12Y, 12M, and 12C. A Y direction (specifically, +Y direction) is defined as a movement direction of the medium P when the medium P passes through the process units 12K, 12Y, 12M, and 12C.

A Z direction is defined as a direction perpendicular to both the X direction and the Y direction. In this example, a +Z direction is defined as a direction from the LED head 10 toward the photosensitive drum 13, and a −Z direction is defined as an opposite direction to the +Z direction.

Configuration of LED Head

Figure 2:
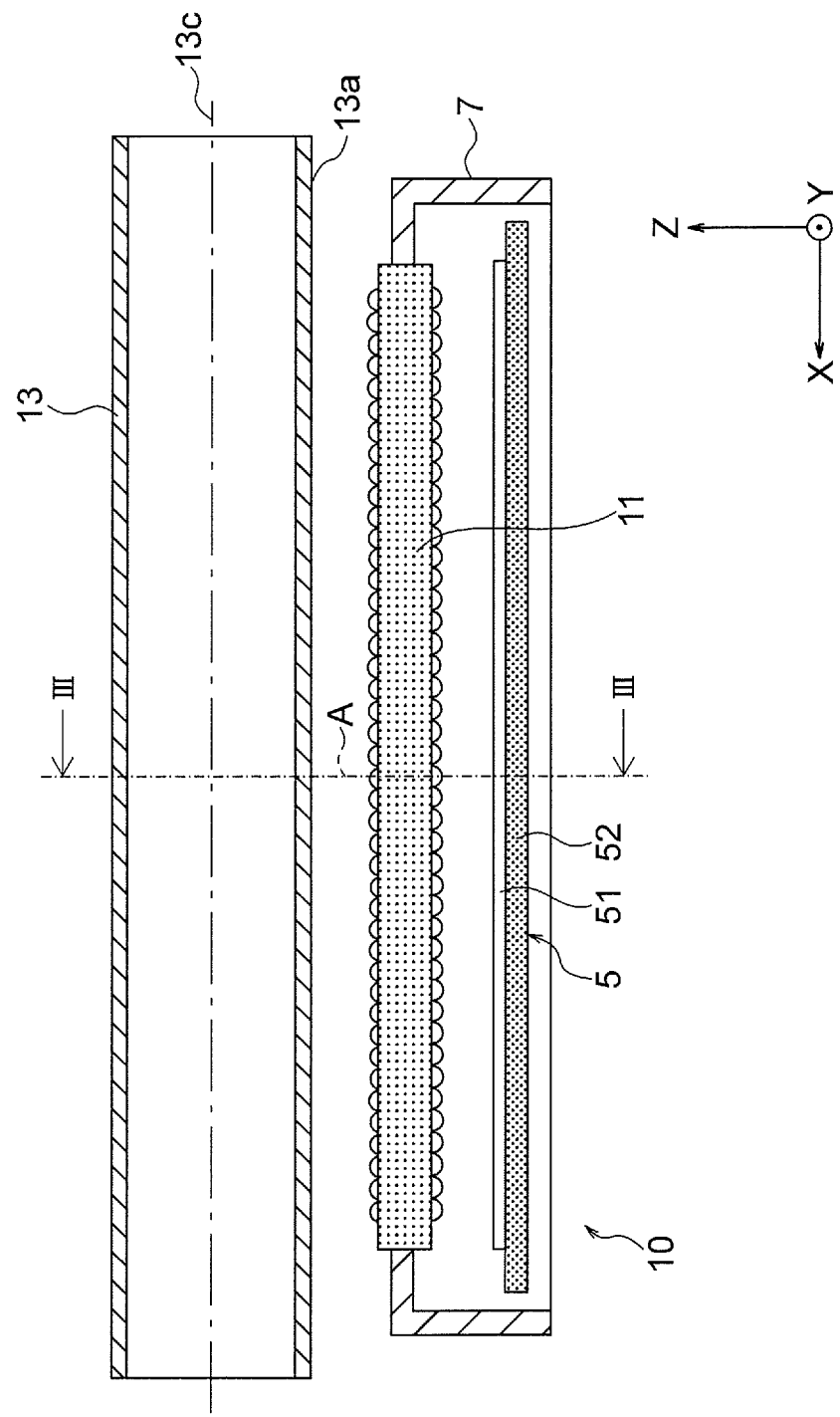
FIG. 2 is a sectional view showing an LED head of Embodiment 1.
Figure 3:
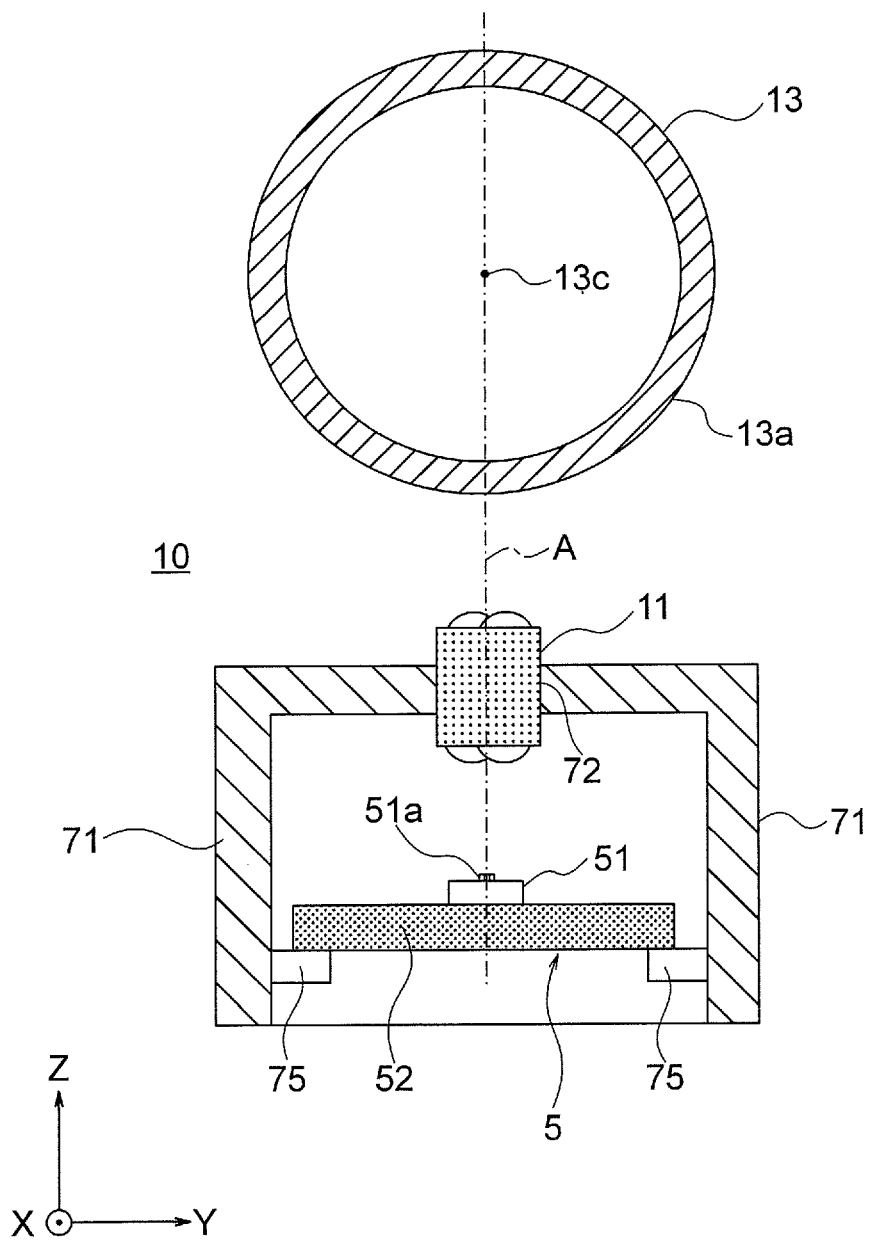
FIG. 3 is another sectional view showing the LED head of Embodiment 1.

Next, a configuration of the LED head 10 as the exposure device will be described. FIG. 2 is a sectional view of the LED head 10 taken along a plane parallel to the XZ plane. FIG. 3 is a sectional view of the LED head 10 taken along a plane parallel to the YZ plane. FIGS. 2 and 3 also show the photosensitive drum 13.

As shown in FIGS. 2 and 3, the LED head 10 includes a lens unit 11 disposed to face the photosensitive drum 13, a wiring board 5 disposed on the opposite side to the photosensitive drum 13 with respect to the lens unit 11, and a holder 7 as a holding member that holds the lens unit 11 and the wiring board 5.

The wiring board 5 includes a substrate 52 made of an epoxy glass or the like. An LED array chip 51 having LEDs (light emitting diodes) 51a as a plurality of light emitting elements and a drive circuit for driving the LED array chip 51 are mounted on the substrate 52.

An emission direction of light from each LED 51a of the LED array chip 51 is the +Z direction. The LEDs 51a are arranged in a row in the X direction (i.e., in the axial direction of the photosensitive drum 13). Thus, the X direction is also referred to as a main scanning direction, while the Y direction is also referred to as a sub-scanning direction.

The lens unit 11 causes the light emitted from the LEDs 51a of the LED array chip 51 to form an image on a surface 13a of the photosensitive drum 13. A configuration of the lens unit 11 will be described later.

The holder 7 is a casing which is opened in the −Z direction. The holder 7 has a wall 71. The wiring board 5 is fixed to fixing members 75 provided inside the wall 71. The holder 7 has an opening 72 on its side facing the photosensitive drum 13. The lens unit 11 is fixed to the opening 72 by bonding or the like. The holder 7 is not limited to the configuration shown in FIGS. 2 and 3. The holder 7 may have any configuration capable of holding the wiring board 5 and the lens unit 11 while positioning them in the Z direction.

Figure 4:
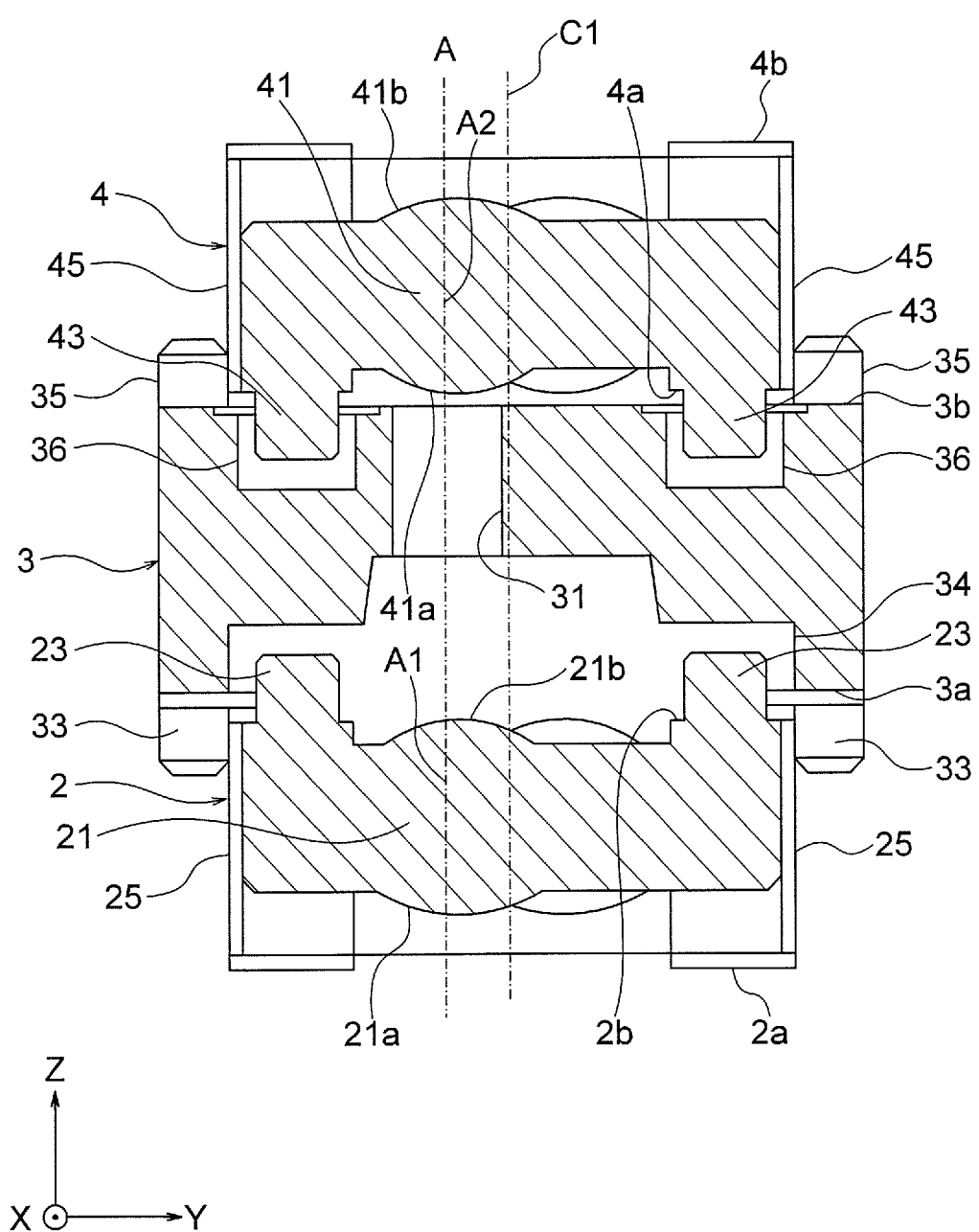
FIG. 4 is a sectional view showing a lens unit of Embodiment 1.

FIG. 4 is a sectional view of the lens unit 11. The lens unit 11 includes a first lens array 2, a light shielding plate 3 as a light shielding member (first light shielding member), and a second lens array 4, which are arranged in a proceeding direction (i.e., +Z direction) of the light emitted from the LED 51a (see FIG. 3).

Each of the first lens array 2 and the second lens array 4 is integrally formed of resin such as a cycloolefin polymer. The light shielding plate 3 is formed of resin such as a polycarbonate.

The first lens array 2 includes a plurality of lens elements 21 (first lens elements) which are microlenses. Each lens element 21 has a lens surface 21a on which the light from the LED 51a (see FIG. 3) is incident, and a lens surface 21b from which the light is emitted. The lens element 21 has an optical axis A1 (first optical axis) in the Z direction.

The light shielding plate 3 has a plurality of openings 31 as apertures. Each of the openings 31 is, for example, cylindrical, and its central axis is on the substantially same straight line as (i.e., substantially coaxial with) the optical axis A1 of the lens element 21. The openings 31 of the light shielding plate 3 allow light from the lens elements 21 in the first lens array 2 to pass therethrough.

The second lens array 4 includes a plurality of lens elements 41 (second lens elements), which are microlenses. Each lens element 41 has a lens surface 41a on which the light passing through the opening 31 of the light shielding plate 3 is incident and a lens surface 41b from which the light is emitted. The lens element 41 has an optical axis A2 (second optical axis) in the Z direction.

The optical axis A1 of the lens element 21 substantially coincides (i.e., is substantially coaxial) with the optical axis A2 of the lens element 41. The optical axes A1 and A2 define an optical axis A of the lens unit 11.

Figure 5A:
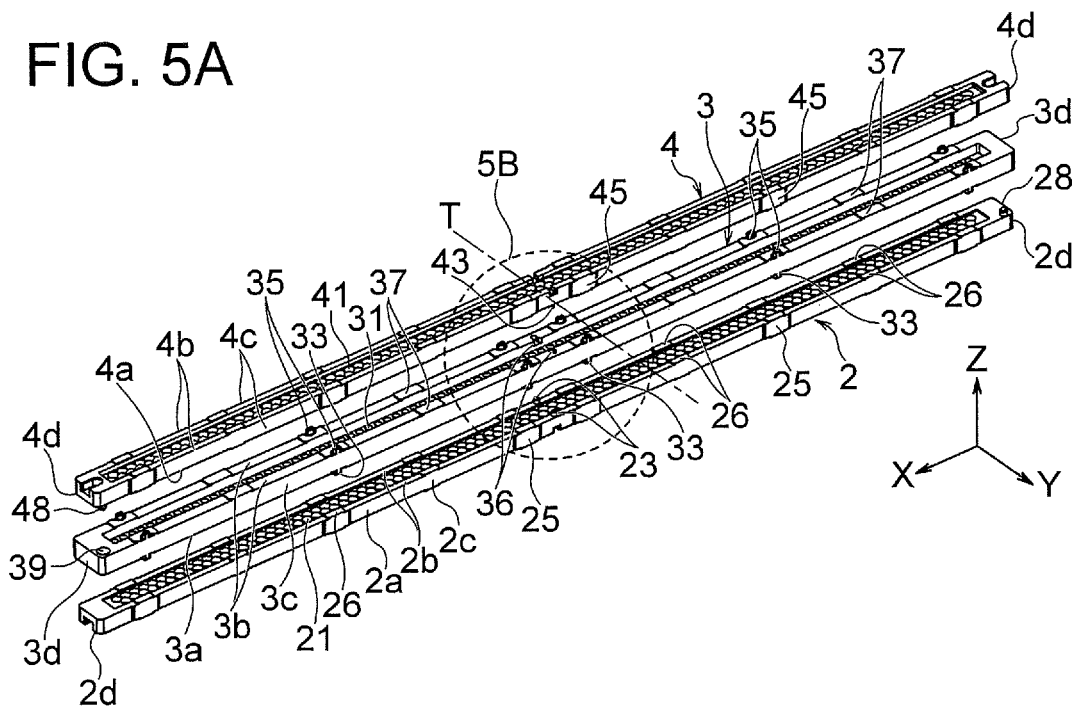
FIG. 5A is an exploded perspective view showing the lens unit of Embodiment 1.
Figure 5B:
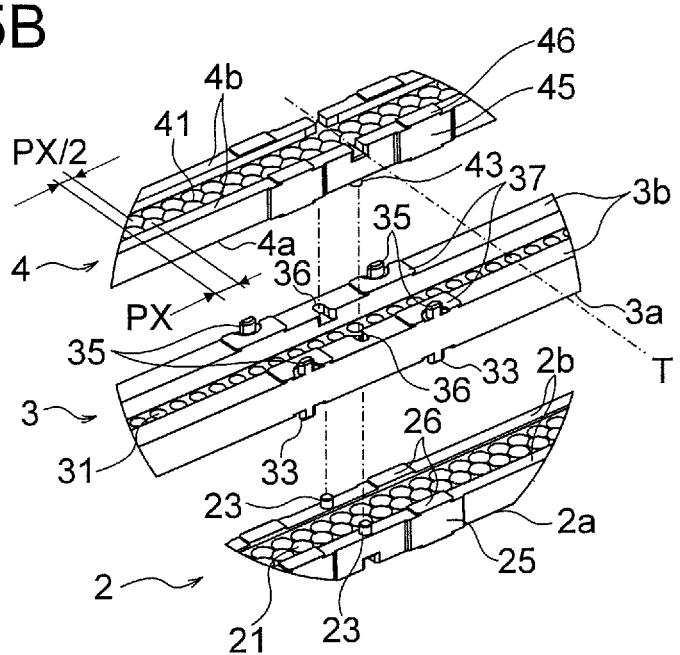
FIG. 5B is a partially enlarged view showing the lens unit of Embodiment 1.
Figure 6A:
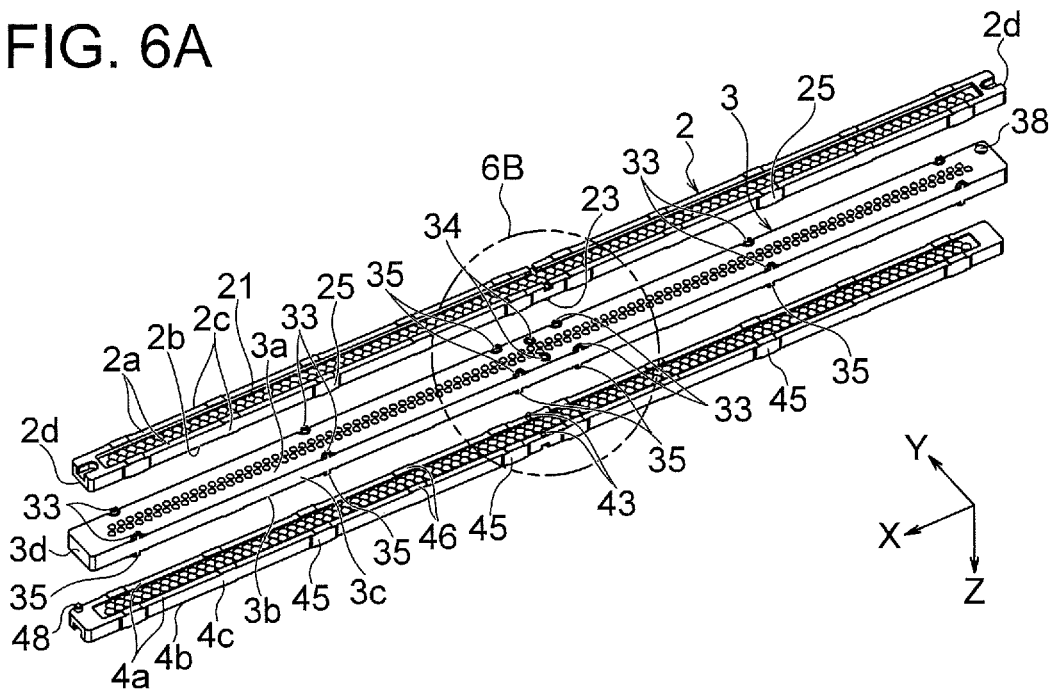
FIG. 6A is an exploded perspective view of the lens unit of Embodiment 1 as viewed from the opposite side to FIG. 5A.
Figure 6B:
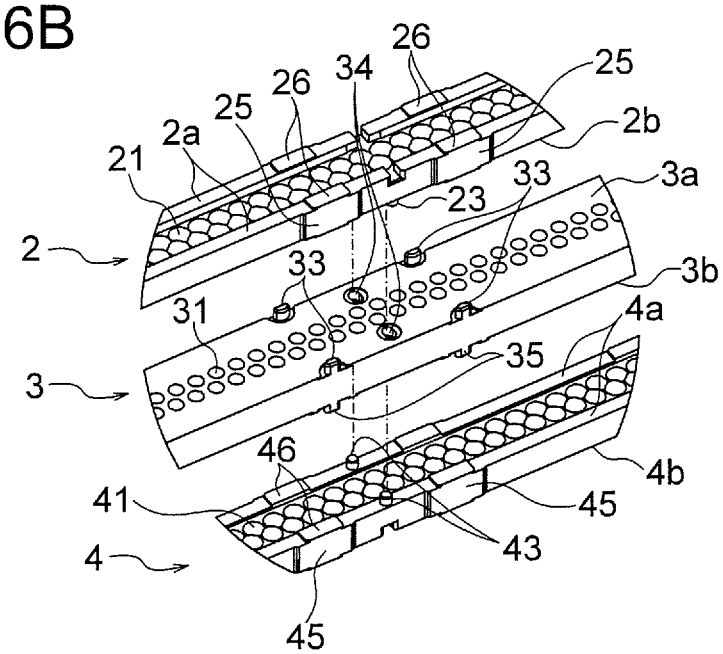
FIG. 6B is a partially enlarged view of the lens unit of Embodiment 1 as viewed from the opposite side to FIG. 5B.

Next, the individual components of the lens unit 11 will be described. FIG. 5A is an exploded perspective view showing the lens unit 11. FIG. 5B is an enlarged view showing a central portion in the X direction of the lens unit 11 shown in FIG. 5A. FIG. 6A is an exploded perspective view of the lens unit 11 as viewed from the opposite direction to FIG. 5A. FIG. 6B is an enlarged view of the central portion in the X direction of the lens unit 11 shown in FIG. 6A.

Configuration of First Lens Array

As shown in FIG. 5A, the first lens array 2 has a plurality of lens elements 21 arranged in the X direction. The lens elements 21 are arranged in two rows in a staggered pattern. Furthermore, the lens elements 21 are arranged at constant arrangement intervals in the X direction in each row.

The first lens array 2 is elongated in the X direction and has a width in the Y direction. The first lens array 2 has a lower surface 2a located at an end on the −Z direction side, an upper surface 2b located at an end on the +Z direction side, two side surfaces 2c located at both ends in the Y direction, and two end surfaces 2d located at both ends in the X direction.

As shown in FIG. 5B, bosses 23 as first positioning portions protruding in the +Z direction are formed on the upper surface 2b of the first lens array 2. The bosses 23 are formed at the center of the first lens array 2 in the X direction. In this example, the two bosses 23 are formed on both sides of an arrangement region of the lens elements 21 in the first lens array 2 in the Y direction. Each of the bosses 23 engages with a concave portion 34 of the light shielding plate 3, as described later.

As shown in FIG. 5A, guide surfaces 25 are formed on both side surfaces 2c of the first lens array 2. The guide surfaces 25 are formed on both sides of an arrangement region of the lens elements 21 in the Y direction, and specifically at a plurality of positions (in this example, six positions) in the X direction on each side. The guide surface 25 is a surface that contacts a guide portion 33 (to be described later) of the light shielding plate 3, thereby positioning the first lens array 2 in the Y direction.

Contact surfaces 26 are formed on the upper surface 2b of the first lens array 2. The contact surfaces 26 are formed on both sides in the Y direction of the arrangement region of the lens elements 21 and specifically at a plurality of positions (in this example, eight positions) in the X direction on each side. The contact surface 26 is a surface that contacts a lower surface 3a (to be described later) of the light shielding plate 3, thereby positioning the first lens array 2 in the Z direction.

A protrusion 28 as a first engaging portion protruding in the +Z direction is formed on the upper surface 2b of the first lens array 2. The single protrusion 28 is formed at one end of the first lens array 2 in both the X direction and the Y direction. The protrusion 28 is engaged with a hole 38 (to be described later) of the light shielding plate 3 in a state where the first lens array 2 and the light shielding plate 3 are combined together in a correct orientation.

Configuration of Light Shielding Plate

The light shielding plate 3 has a plurality of openings 31 arranged in the X direction. The openings 31 are arranged in two rows in a staggered pattern. The openings 31 are arranged at constant arrangement intervals (same as the arrangement intervals of the lens elements 21) in the X direction in each row.

The light shielding plate 3 is elongated in the X direction and has its width in the Y direction wider than the width of each of the lens arrays 2 and 4. The light shielding plate 3 has a lower surface 3a located at an end on the −Z direction side, an upper surface 3b located at an end on the +Z direction side, two side surfaces 3c located at both ends in the Y direction, and two end surfaces 3d located at both ends in the X direction.

As shown in FIG. 6B, concave portions 34 (i.e., first fitting portions) are formed on the lower surface 3a of the light shielding plate 3. Each concave portion 34 is formed at a center of the light shielding plate 3 in the X direction. In this example, the two concave portions 34 are formed on both sides of an arrangement region of the openings 31 in the light shielding plate 3 in the Y direction. The concave portion 34 is a portion that engages with the boss 23 in the first lens array 2.

Similarly, as shown in FIG. 5B, concave portions 36 (i.e., second fitting portions) are formed on the upper surface 3b of the light shielding plate 3. Each concave portion 36 is formed at the center of the light shielding plate 3 in the X direction. In this example, the two concave portions 36 are formed on both sides of the arrangement region of the openings 31 in the light shielding plate 3 in the Y direction. The concave portion 36 is a portion that engages with a boss 43 (see FIG. 4) in the second lens array 4.

As shown in FIG. 6A, the guide portions 33 (i.e., first guide portions) protruding in the −Z direction are formed on the lower surface 3a of the light shielding plate 3. The guide portions 33 are formed on both sides of the arrangement region of the openings 31 in the light shielding plate 3 in the Y direction, and specifically at a plurality of positions (in this example, six positions) in the X direction on each side. The guide portion 33 is a portion that contacts the guide surface 25 of the first lens array 2, thereby positioning the first lens array 2 in the Y direction.

Similarly, as shown in FIG. 6B, guide portions 35 (i.e., second guide portions) protruding in the +Z direction are formed on the upper surface 3b of the light shielding plate 3. The guide portions 35 are formed on both sides of the arrangement region of the openings 31 in the light shielding plate 3 in the Y direction, and specifically, at a plurality of positions (in this example, six positions) in the X direction on each side. The guide portion 35 is a portion that contacts the guide surface 45 of the second lens array 4, thereby positioning the second lens array 4 in the Y direction.

As shown in FIG. 6A, the hole 38 (i.e., a first engaged portion) is formed on the lower surface 3a of the light shielding plate 3. The single hole 38 is formed at one end of the light shielding plate 3 in both the X direction and the Y direction. The hole 38 is engaged with the protrusion 28 of the first lens array 2 in a state where the light shielding plate 3 and the first lens array 2 are combined together in the correct direction.

Similarly, as shown in FIG. 5A, a hole 39 (i.e., a second engaged portion) is formed on the upper surface 3b of the light shielding plate 3. The hole 39 is formed at one end on the opposite side to the hole 38 in the X direction and on the same side as the hole 38 in the Y direction. The hole 39 is engaged with the protrusion 48 of the second lens array 4 in a state where the light shielding plate 3 and the second lens array 4 are combined together in the correct direction.

Contact surfaces 37 are formed on the upper surface 3b of the light shielding plate 3. The contact surfaces 37 are formed on both sides of the arrangement region of the openings 31 in the Y direction and specifically at a plurality of positions (in this example, ten positions) in the X direction on each side. The contact surface 37 is a surface that contacts a lower surface 4a (to be described later) of the second lens array 4, thereby positioning the light shielding plate 3 in the Z direction.

Second Lens Array

The second lens array 4 has a plurality of lens elements 41 arranged in the X direction. The lens elements 41 are arranged in two rows in a staggered pattern. The lens elements 41 are arranged at certain arrangement intervals (same as the arrangement intervals of the lens elements 21) in the X direction in each row.

The second lens array 4 is elongated in the X direction and has a width in the Y direction. The second lens array 4 has the lower surface 4a located at an end on the −Z direction side, an upper surface 4b located at an end on the +Z direction side, two side surfaces 4c located at both ends in the Y direction, and two end surfaces 4d located at both ends in the X direction.

As shown in FIG. 6B, bosses 43 (i.e., second positioning portions) protruding in the −Z direction are formed on the lower surface 4a of the second lens array 4. The bosses 43 are formed at a center of the second lens array 4 in the X direction. In this example, the two bosses 43 are formed on both sides of an arrangement region of the lens elements 41 in the second lens array 4 in the Y direction. Each of the bosses 43 engages with the concave portion 36 (FIG. 5A) of the light shielding plate 3.

As shown in FIG. 6A, guide surfaces 45 are formed on both side surfaces 4c of the second lens array 4. The guide surfaces 45 are formed on both sides of the arrangement region of the lens elements 41 in the Y direction and specifically at a plurality of positions (in this example, six positions) in the X direction on each side. The guide surface 45 is a surface that contacts the guide portion 35 of the light shielding plate 3, thereby positioning the second lens array 4 in the Y direction.

Contact surfaces 46 are formed on the lower surface 4a of the second lens array 4. The contact surfaces 46 are formed on both sides of the arrangement region of the lens elements 41 in the Y direction and specifically at a plurality of positions (in this example, eight positions) in the X direction on each side. The contact surface 46 is a surface that contacts the upper surface 3b of the light shielding plate 3, thereby positioning the second lens array 4 in the Z direction.

A protrusion 48 (i.e., a second engaging portion) protruding in the −Z direction is formed on the lower surface 4a of the second lens array 4. The protrusion 48 of the second lens array 4 is formed on the opposite side to the protrusion 28 (FIG. 5A) of the first lens array 2 in the X direction and on the same side as the protrusion 28 (FIG. 5A) in the Y direction. The protrusion 48 is engaged with the hole 39 (FIG. 5A) of the light shielding plate 3 in a state where the second lens array 4 and the light shielding plate 3 are combined together in the correct orientation.

Assembly Process of Lens Unit

The first lens array 2 and the second lens array 4 have the same shape. Thus, these lens arrays 2 and 4 can be formed of molded bodies produced using the same mold in a manufacturing process. Specifically, the two molded bodies with the same shape are formed by injection molding of a resin such as a cycloolefin polymer, using the same mold.

Figure 7A:
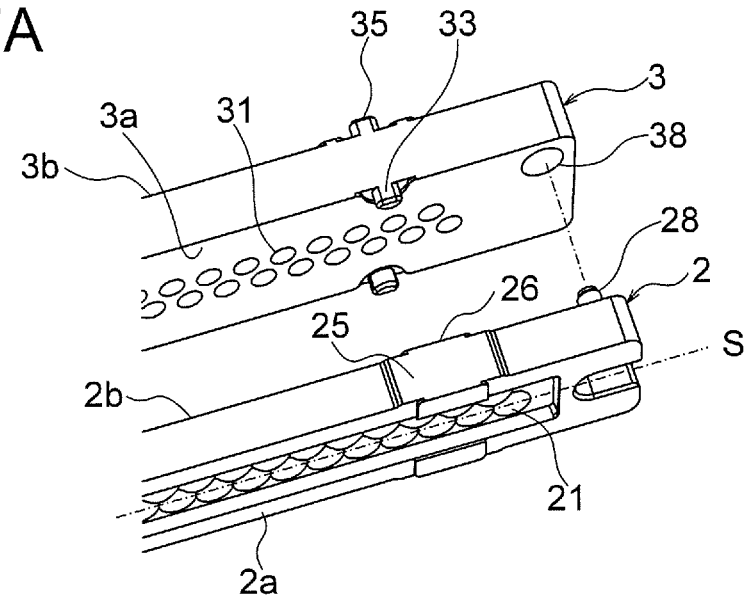
FIGS. 7A and 7B are schematic diagrams showing a state where the lens arrays are mounted to a light shielding plate of Embodiment 1.

When assembling the lens unit 11, one of the two molded bodies (as the first lens array 2) is mounted to the lower surface 3a side of the light shielding plate 3. Specifically, the bosses 23 (FIG. 5A) of the first lens array 2 are fitted into the concave portions 34 (FIG. 6A) of the light shielding plate 3. At this time, as shown in FIG. 7A, the protrusion 28 of the first lens array 2 is inserted into the hole 38 of the light shielding plate 3.

In this state, the guide portions 33 of the light shielding plate 3 are engaged with the guide surfaces 25 of the first lens array 2, and the contact surfaces 26 of the first lens array 2 come into contact with the lower surface 3a of the light shielding plate 3. Thus, the first lens array 2 and the light shielding plate 3 are positioned with respect to each other in the X, Y, and Z directions.

Then, the other of the molded bodies (as the second lens array 4) is rotated relative to the first lens array 2 about a virtual line T in the Y direction as a rotational axis by 180 degrees. Then, the second lens array 4 is mounted to the upper surface 3b side of the light shielding plate 3 such that the optical axes A1 and A2 of the lens elements 21 and 41 located substantially at the centers of the lens arrays 2 and 4 in the X direction substantially coincide with each other. The bosses 43 (FIG. 6B) of the second lens array 4 are fitted into the concave portions 36 (FIG. 5B) of the light shielding plate 3. The protrusion 48 (FIG. 6A) of the second lens array 4 is inserted into the hole 39 (FIG. 5A) of the light shielding plate 3.

Figure 7B:
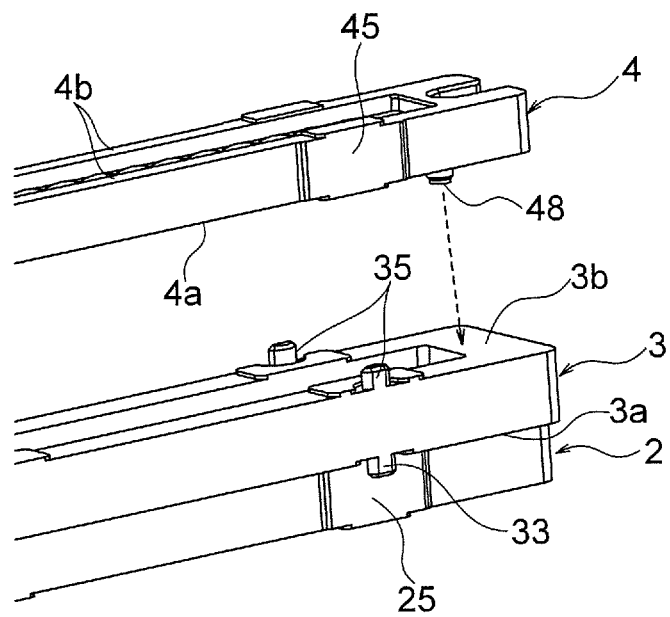

At this time, when the second lens array 4 is erroneously rotated relative to the first lens array 2 about a virtual line in the X direction as a rotational axis by 180 degrees and then mounted to the light shielding plate 3, the protrusion 48 of the second lens array 4 abuts against the upper surface 3b of the light shielding plate 3 as shown in FIG. 7B. That is, the second lens array 4 cannot be mounted to the light shielding plate 3. Consequently, the mounting of the lens arrays in an incorrect orientation can be prevented.

In this way, the assembly process of the lens unit 11 is completed. In the lens unit 11, the positioning of the lens arrays 2 and 4 and the light shielding plate 3 in the X direction is achieved by the bosses 23 and 43 located at the center of the lens unit 11 in the X direction. Thus, the deviation between the optical axes of the lens elements 21 and 41 can be reduced, and the deviation between each optical axis and the central axis of the opening 31 can be reduced, even when thermal expansion or thermal contraction of the lens arrays 2 and 4 and the light shielding plate 3 occurs.

As described above, the second lens array 4 is rotated relative to the first lens array 2 about the virtual line T in the Y direction as the rotational axis by 180 degrees. In this position, the second lens array 4 is attached to the light shielding plate 3 so that the optical axes A1 and A2 of the lens elements 21 and 41 located substantially at the centers of the lens arrays 2 and 4 in the X direction substantially coincide with each other. In this regard, the substantial center of the lens array 2 (4) in the X direction is not limited to an exact center of the lens array 2 (4) in the X direction, but may be deviated therefrom by an amount corresponding to, for example, several (a few) lens elements 21 (41).

Further, an expression that the optical axes A1 and A2 substantially coincide each other means that the optical axes A1 and A2 are within a range of a deviation (ΔP shown in FIG. 12A described later) of the arrangement interval of the lens elements 21 or 41 (with respect to a case where the optical axes A1 and A2 exactly coincide each other), which may be generated in the manufacturing process.

A relationship between the first lens array 2 and the second lens array 4 may be reversed. That is, instead of rotating the second lens array 4 relative to the first lens array 2 about the virtual line T in the Y direction as the rotational axis by 180 degrees, the first lens array 2 may be rotated relative to the second lens array 4 about the virtual line T in the Y direction as the rotational axis by 180 degrees.

The bosses 23 and 43 are most desirably positioned at the centers of the lens arrays 2 and 4 in the X direction. However, the bosses 23 and 43 do not need to be positioned at the exact centers of the lens arrays 2 and 4 in the X direction. From the viewpoint of preventing a deviation between the optical axes upon thermal expansion, thermal contraction or the like, it is desirable that the bosses 23 and 43 are positioned substantially at the centers of the lens arrays 2 and 4 in the X direction. In other words, the bosses 23 and 43 only need to be positioned in regions other than both end portions of the lens arrays 2 and 4.

As described above, each of the lens arrays 2 and 4 is formed by injection molding. It is preferable that a gate of a mold for injection molding may be located at a position corresponds to the substantially center of the lens array 2 (4) in the X direction. In this case, the resin flows from the center toward both ends of the lens array 2 (4) in the X direction, and thus material characteristics (such as densities) of the lens element 21 (41) has a distribution from the center toward both ends of the material in the X direction.

In Embodiment 1, the second lens array 4 is in a positional relationship relative to the first lens array 2 in which the second lens array 4 is rotated about the virtual line T in the Y direction as the rotational axis by 180 degrees. In addition, the optical axes A1 and A2 of the lens elements 21 and 41, located at the substantially centers of the lens arrays 2 and 4 in the X direction, are arranged to substantially coincide with each other. Thus, material characteristics of the lens elements 21 and 41 facing each other in the Z direction can be made similar.

In this regard, the first lens array 2 and the second lens array 4 are not required to have exactly the same shape as long as they are formed by the same mold.

Although the protrusions 28 and 48 of the lens arrays 2 and 4 are formed at one ends of the lens arrays 2 and 4 in both the X direction and the Y direction, the protrusions 28 and 48 may be disposed at other positions as long as the lens arrays 2 and 4 can be prevented from being mounted to the light shielding plate 3 in the incorrect orientation. The lens arrays 2 and 4 and the light shielding plate 3 may be provided with portions that do not engage each other when the lens arrays 2 and 4 are mounted to the light shielding plate 3 in the incorrect orientation.

Arrangement of Lens Elements and Openings

Next, the arrangement of the lens elements 21 and 41 in the lens arrays 2 and 4 and the openings 31 of the light shielding plate 3 will be described. FIG. 8A is a plan view of the first lens array 2 as viewed from the +Z side (emission side). FIG. 8B is a plan view of the first lens array 2 as viewed from the −Z side (incident side).

As shown in FIG. 8A, the lens elements 21 in the first lens array 2 are arranged in two rows (hereinafter referred to as rows 211 and 212) in a staggered pattern. The lens elements 21 in each row are arranged at arrangement intervals PX in the X direction. The arrangement interval PX refers to the shortest distance between centers (i.e., between optical axes A1) of the adjacent lens elements 21 in the same row in the X direction. PY represents an interval between the rows 211 and 212 of the lens elements 21 in the Y direction.

In the lens element 21, a radius of the lens surface 21a (FIG. 8B) on the incident side is larger than a radius of the lens surface 21b (FIG. 8A) on the emission side. Thus, the lens elements 21 of the same row are separated from each other on the emission side shown in FIG. 8A, while the lens elements 21 of the same row are in contact with each other on the incident side shown in FIG. 8B. However, the lens element is not limited to such a lens shape.

As described above, the second lens array 4 has the same shape as that of the first lens array 2 and is in a positional relationship relative to the first lens array 2 such that the second lens array 4 is rotated about the virtual line T in the Y direction as the rotational axis by 180 degrees.

As shown in FIG. 8A, the virtual line T passes through the optical axis A1 of any of the lens element 21 or through an intermediate position N between two lens elements 21 adjacent to each other in the X direction. Thus, when the second lens array 4 is rotated relative to the first lens array 2 about the virtual line T as the rotational axis by 180 degrees, the optical axes A1 and A2 of the lens elements 21 and 41 located substantially at the centers of the lens arrays 2 and 4 in the X direction substantially coincide with each other. In this example, the virtual line T passes through the optical axis A1 of one of the lens elements 21 of the row 212 and also through an intermediate position N between the two adjacent lens elements 21 of the row 211.

FIG. 9A is a plan view of the light shielding plate 3 as viewed from the +Z side (emission side). FIG. 9B is a plan view of the light shielding plate 3 as viewed from the −Z side (incident side). The openings 31 of the light shielding plate 3 are arranged in two rows (hereinafter referred to as rows 311 and 312) in a staggered pattern. The openings 31 in each row are arranged at the same arrangement intervals PX as the lens elements 21 in the X direction. The arrangement interval PX refers to the shortest distance between the centers of the adjacent openings 31 adjacent to each other in the X direction. PY represents an interval between the rows 311 and 312 of the openings 31 in the Y direction.

Operation of Lens Unit 11

Figure 10:
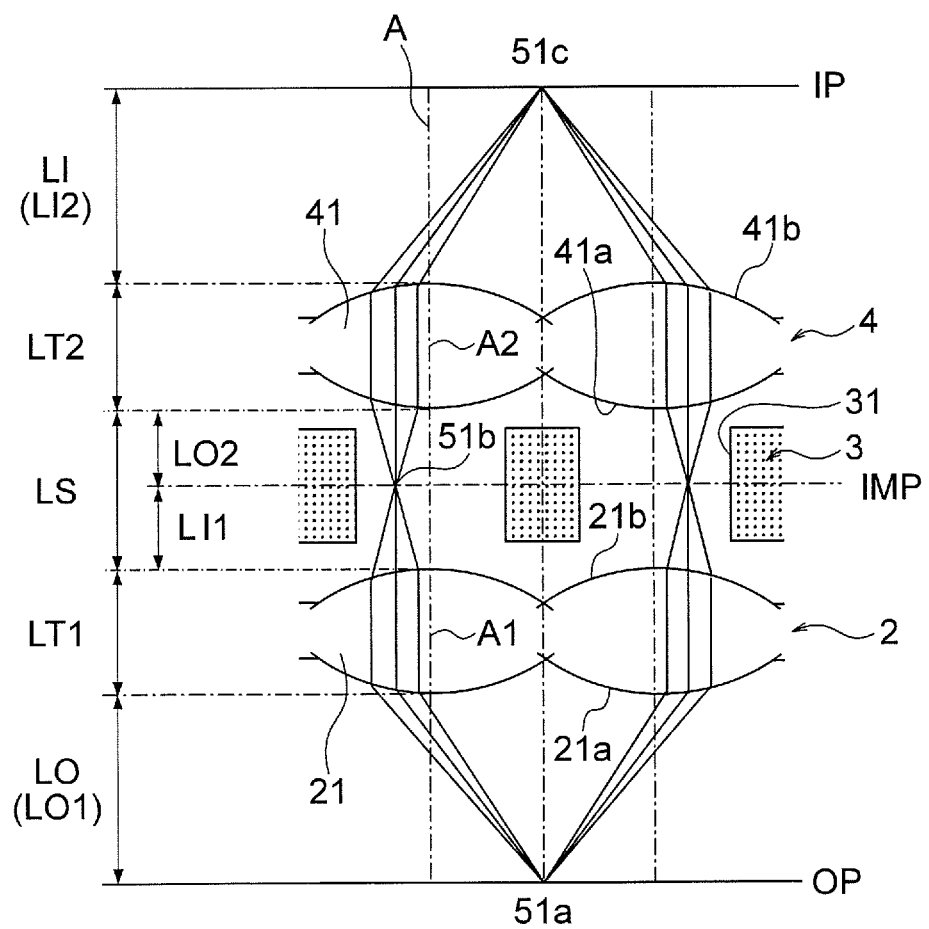
FIG. 10 is a diagram showing a function of the lens unit of Embodiment 1.

FIG. 10 is a diagram for explaining a function of the lens unit 11 and corresponds to a sectional view taken along line 10-10 in FIG. 8A. As described above, the optical axes A1 and A2 of the lens elements 21 and 41 in the first and second lens arrays 2 and 4, which face each other in the Z direction, substantially coincide with each other. The optical axis A of the lens unit 11 is defined by the optical axes A1 and A2.

An object plane OP of the lens unit 11 coincides with the LED 51a in an LED array chip 51 on the wiring board 5. The object plane OP and the lens element 21 in the first lens array 2 are spaced apart from each other by a distance LO in the direction of the optical axis A (hereinafter referred to as an optical axis direction).

Each lens element 21 in the first lens array 2 has a thickness LT1 in the optical axis direction. The lens element 21 in the first lens array 2 forms an intermediate image 51b of the LED 51a (object) on an intermediate image plane IMP spaced apart from the lens element 21 by a distance LI1 in the optical axis direction.

The lens element 41 in the second lens array 4 is spaced apart from the lens element 21 in the first lens array 2 by a distance (surface interval) LS in the optical axis direction. The lens element 41 in the second lens array 4 is spaced apart from the intermediate image plane IMP by a distance LO2 in the optical axis direction.

The lens element 41 in the second lens array 4 has a thickness LT2 in the optical axis direction. The lens element 41 in the second lens array 4 forms an image 51c of the intermediate image 51b (on the intermediate image plane IMP) at a position spaced apart from the lens element 41 by a distance LI in the optical axis direction.

A distance LO from the object plane OP to the lens element 21 and a distance LI from the lens element 41 to the imaging plane IP is the same as each other (LO=LI). A distance LS between the lens elements 21 and 41 is a sum of the distance LI1 and the distance LO2 described above (LS=LI1+LO2).

As described above, the first lens array 2 and the second lens array 4 have the same shape. Further, the second lens array 4 is located at a position such that the second lens array 4 is rotated relative to the first lens array 2 about the virtual line T in the Y direction by 180 degrees. Thus, the thickness LT1 of the lens element 21 is the same as the thickness LT2 of the lens element 41.

The lens surface 21a of the lens element 21 and the lens surface 41b of the lens element 41 have the same surface shape. The lens surface 21b of the lens element 21 and the lens surface 41a of the lens element 41 have the same surface shape. The distance LS between the lens elements 21 and 41 is twice (2×L) as large as the distance LO2 described above, or twice (2×LI1) as large as the distance LI1.

In this way, in the lens unit 11, the first lens array 2 and the second lens array 4 are arranged symmetrically with the light shielding plate 3 disposed therebetween. The lens element 21 and the lens element 41 are arranged at conjugate positions so that their optical axes A1 and A2 coincide with each other, thereby constituting an optical system with an erecting equal-magnification. As a result, the lens unit 11 forms an erecting equal-magnification image of the LED 51a (object) on the imaging plane IP.

In the lens unit 11, the image of the common LED 51a is formed on the imaging plane IP by two adjacent lens elements 21 in different rows of the lens array 2 and two adjacent lens elements 41 in different rows of the lens array 4.

The light shielding plate 3 prevents light (i.e., stray light) other than the light from the lens element 21 that faces the lens element 41 in the optical axis direction, from entering the lens elements 41.

Operation of Image Forming Apparatus

Next, an image forming operation performed by the image forming apparatus 1 will be described with reference to FIGS. 1 and 3. A controller of the image forming apparatus 1 starts the image forming operation based on a print command sent from a host device. First, the feed roller 112 rotates to feed the media P from the sheet cassette 111 one by one to the conveying path. Further, the conveying rollers 113 rotate at a predetermined timing to convey the medium P fed to the conveying path, toward the conveying belt 121. The conveying belt 121 travels in a direction indicated by an arrow B by the rotation of the drive roller 122. The conveying belt 121 holds the medium P by adsorbing, and conveys the medium P.

In each of the process units 12K, 12Y, 12M, and 12C, the surface of the photosensitive drum 13 is electrically charged uniformly by the charging roller 14.

Further, the LED heads 10K, 10Y, 10M, and 10C emit light to irradiate the photosensitive drums 13 according to image data for each color. The light emitted from the lens unit 11 of each of the LED heads 10 is converged onto the surface 13a of the photosensitive drum 13, and an electrostatic latent image is formed on a photosensitive layer on the surface 13a of the photosensitive drum 13.

The electrostatic latent image formed on the surface 13a of the photosensitive drum 13 is developed with the toner by the developing roller 15, and becomes a toner image. Subsequently, together with the traveling of the conveying belt 121, the medium P passes through between each of the process units 12K, 12Y, 12M, and 12C and the corresponding transfer roller 19. At this time, the toner images formed on the surfaces of the photosensitive drums 13 are sequentially transferred to the medium P on the conveying belt 121.

The medium P with the toner image transferred thereto is sent to the fixing device 130. In the fixing device 130, the toner images are heated and pressurized by the fixing roller 131 and the pressure roller 132, so that the toner image is melted and fixed to the medium P. The medium P with the toner image fixed thereto is ejected by the ejection rollers 141 and 142 to the outside of the image forming apparatus 1. In this way, the ejected media P are stacked on the stacker portion 150 provided on the upper portion of the image forming apparatus 1.

Next, an operation of the LED head 10 as the exposure device will be described with reference to FIG. 10. When receiving a control signal from the controller of the image forming apparatus 1, the drive circuit on the wiring board 5 in the LED head 10 causes the LED 51a to emit light. The light emitted from each LED 51a is converged onto the surface 13a of the photosensitive drum 13 via the lens unit 11.

The light emitted from the LED 51a is incident on the lens element 21 in the first lens array 2, and forms the intermediate image 51b on the intermediate image plane IMP spaced apart from the lens element 21 by the distance LI1 in the optical axis direction. Then, the image 51c of the intermediate image 51b is formed on the imaging plane IP by the lens elements 41 in the second lens array 4. That is, the image 51c of the LED 51a (object) is formed on the imaging plane IP.

The intermediate image 51b formed by the lens elements 21 in the first lens array 2 is a reduced inverted image of the LED 51a. The image 51c formed by the lens elements 41 in the second lens array 4 is a magnified inverted image of the intermediate image 51b. The first lens array 2 and the second lens array 4 have the same shape, but are arranged inversely to each other. Thus, when the magnification of the lens element 21 in the first lens array 2 is represented by 1/M, the magnification of the lens element 41 in the second lens array 4 is represented by M, and the image 51c is an erecting unmagnified image of the LED 51a.

Principal rays of light from the respective points on the object plane OP are parallel with each other between the lens element 21 in the first lens array 2 and the lens element 41 in the second lens array 4. That is, the lens elements 21 in the first lens array 2 and the second lens elements 41 in the second lens array 4 constitute a telecentric optical system. In this way, the lens unit 11 forms an erecting equal-magnification image of the LED 51a.

Of the light emitted from the LED 51a and passing through the lens elements 21 in the first lens array 2, light rays which do not contribute to imaging are blocked by the light shielding plate 3 and thus do not enter the lens elements 41 in the second lens array 4.

Function of Embodiments

Next, a function of Embodiment 1 will be described. In the lens unit 11 of Embodiment 1, the lens arrays 2 and 4 are in a positional relationship such that one of the two lens arrays 2 and 4 (for example, the second lens array 4) is rotated relative to the other lens array (for example, the first lens array 2) about the virtual line T perpendicular to the X direction (lens arrangement direction) as the rotational axis by 180 degrees. In addition, the optical axes A1 and A2 of the lens elements 21 and 41, located at the substantially centers of the lens arrays 2 and 4 in the X direction, substantially coincide with each other. Thus, the deviation between the optical axes of the facing lens elements 21 and 41 can be reduced even when there is a variation in the arrangement interval of the lens elements 21 or the arrangement interval of the lens elements 41 due to manufacturing error.

Hereinafter, reduction effect of the deviation between the optical axes (hereinafter referred to as optical axis deviation) will be described. The lens arrays 2 and 4 are processed by a processing machine with high accuracy, but there may be a variation in the arrangement interval PX of the lens elements 21 in the same row during the processing. Thus, there may also be a variation in a pitch PX/2 in the X direction between the adjacent lens elements 21 in the different rows.

Figure 11B:
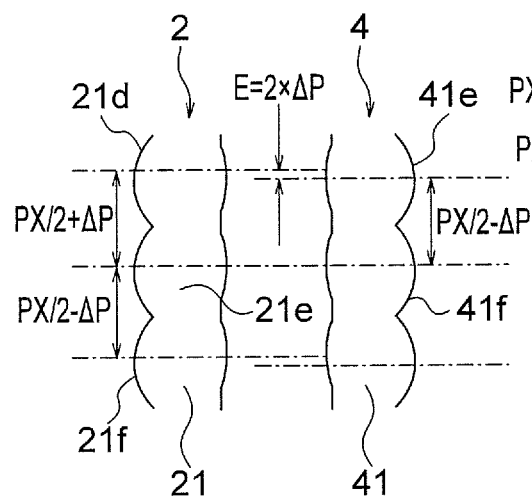
FIGS. 11A and 11B are schematic diagrams for explaining a deviation of optical axes in the lens unit of Comparative Example.
Figure 11A:
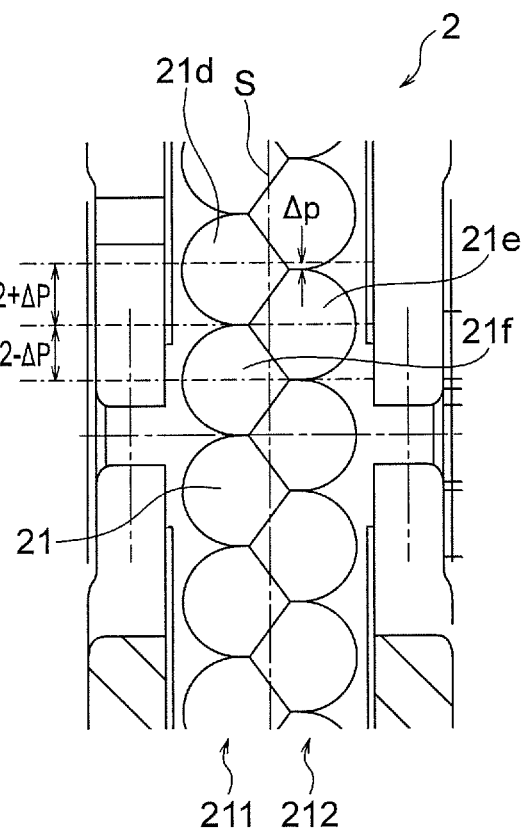

FIG. 11A is a plan view of a first lens array 2 in a lens unit of Comparison Example as viewed from the emission side, and FIG. 11B is a schematic diagram showing sectional shapes of the lens arrays 2 and 4 taken along the XZ plane. In FIG. 11B, the lens elements in two rows of each of the lens arrays 2 and 4 are illustrated in such a manner that they are arranged in one row. Elements of the lens unit in Comparison Example will be explained using the same reference numerals as those in Embodiment 1.

In this example, it is assumed that a lens center of one lens element 21e in one row 212 of the first lens array 2 is deviated by $\Delta P$ in the +X direction. The lens element in the row 211 adjacent to the lens element 21e in the −X direction is referred to as a lens element 21d, and the lens element adjacent to the lens element 21e in the +X direction is referred to as a lens element 21f.

Due to the above described deviation $\Delta P$ of the lens element 21e in the +X direction, an interval between the lens element 21e and the lens element 21d in the X direction is PX/2+$\Delta P$, and an interval between the lens element 21e and the lens element 21f in the X direction is PX/2−$\Delta P$.

In the lens unit of Comparison Example, the second lens array 4 is located at a position such that the second lens array 4 is rotated relative to the first lens array 2 about a virtual line S in the X direction as the rotational axis by 180 degrees and then is shifted in the X direction by PX/2.

In this case, as shown in FIG. 11B, a lens element 41e in the second lens array 4 having the same deviation as the lens element 21e in the first lens array 2 faces the lens element 21d in the Z direction.

Thus, as can be seen from FIG. 11B, a deviation amount E between the optical axis of the lens element 21d in the first lens array 2 and the optical axis of the lens element 41e in the second lens array 4 is 2×ΔP.

FIG. 12A is a plan view of the first lens array 2 in a lens unit 11 of Embodiment 1 as viewed from the emission side. FIG. 12B is a schematic diagram showing the sectional shapes of the lens arrays 2 and 4 taken along the XZ plane. In FIG. 12B, the lens elements in two rows of each of the lens arrays 2 and 4 are illustrated in such a manner that they are arranged in one row.

In the lens unit 11 of Embodiment 1, the second lens array 4 is located at a position such that the second lens array 4 is rotated relative to the first lens array 2 about the virtual line T in the Y direction as the rotational axis by 180 degrees.

Thus, the lens element 41e in the second lens array 4 having the same deviation as the lens element 21e in the first lens array 2 is located at a side opposite to the lens element 21e via the virtual line T. As a result, the deviation amount E between the optical axis of the lens element 21 in the first lens array 2 and the optical axis of the lens element 41 in the second lens array 4 is smaller than that in Comparison Example (2×Δp).

This will be further explained below. As shown in FIG. 12A, the two lens elements 21e and 21g are located at equal intervals from the virtual line T. An interval between the lens element 21e and its adjacent lens element is represented by PX/2+ΔP, an interval between the lens element 21g and its adjacent lens element is represented by PX/2+ΔQ. It is assumed that ΔP>ΔQ is satisfied.

The second lens array 4 is located at a position such that the second lens array 4 is rotated relative to the first lens array 2 about the virtual line T in the Y direction as the rotational axis by 180 degrees. Thus, as shown in FIG. 12B, when a lens element 41g in the second lens array 4 is defined as the lens element 41 facing the lens element 21e in the first lens array 2 in the Z direction, the deviation amount (PX/2+ΔQ) of the lens element 41g is the same as that of the lens element 21e. Therefore, the deviation amount E between the optical axis of the lens element 21e and the optical axis of the lens element 41g is |ΔP−ΔQ| or |ΔP+ΔQ|.

Because ΔP>ΔQ is satisfied as described above, |P−ΔQ| and |ΔP+ΔQ| are both smaller than 2×ΔP. Therefore, the deviation amount E between the optical axis of the lens element 21d in the first lens array 2 and the optical axis of the lens element 41e in the second lens array 4 in Embodiment 1 is smaller than that in Comparison Example (2×ΔP). Although ΔP>ΔQ is satisfied herein, the same applies to the case where ΔP<ΔQ is satisfied.

Figure 13:
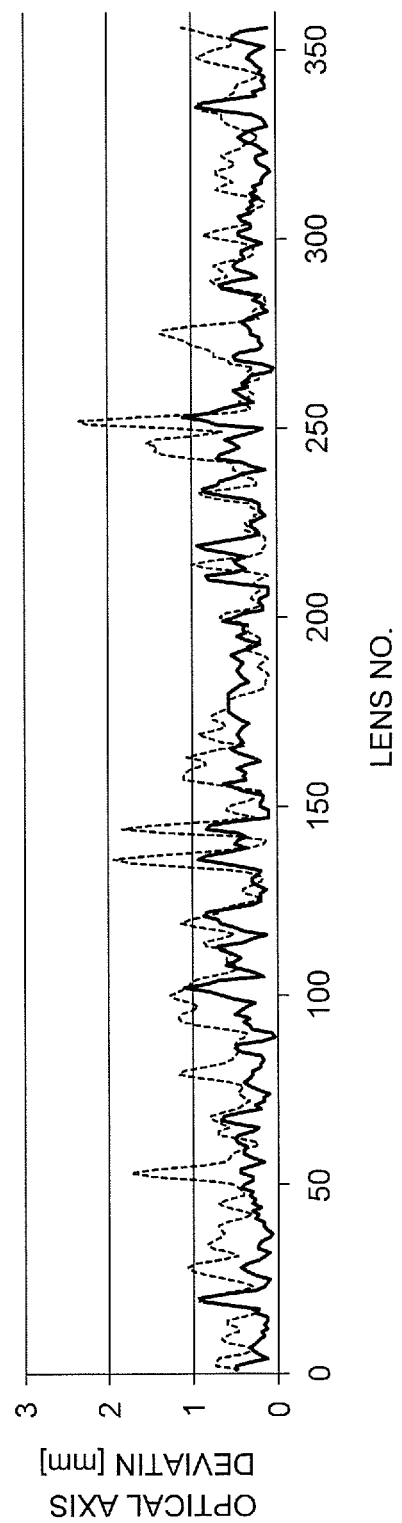
FIG. 13 is a graph showing measurement results of the deviation of optical axes in the lens units of Embodiment 1 and Comparative Example.

FIG. 13 is a graph showing measurement results of deviations of optical axes in the lens units of Embodiment 1 and Comparison Example. The deviation amount E between the optical axes (i.e., optical axis deviation amount E) shown on the vertical axis of FIG. 13 represents each of the optical axis deviation amounts E shown in FIGS. 11B and 12B. The optical axis deviation amounts E are obtained by measuring positions of surface apexes of the lens surfaces 21a, 21b, 41a, and 41b of the respective lens elements 21 and 41 in the lens arrays 2 and 4, and then determining the optical axes of the respective lens elements 21 and 41.

Two lens elements 21 and 41 facing each other in the Z direction are defined as one pair. The pair of lens elements 21 and 41 located at one ends of the respective lens arrays 2 and 4 in the X direction is given No. 1. In this way, the respective pairs of lens elements 21 and 41 are given the numbers (hereinafter referred to as lens numbers) sequentially from No. 1. The horizontal axis in FIG. 13 indicates the lens number.

As can be seen from FIG. 13, in Comparison Example, some lens units have the optical axis deviation amount E larger than 2 μm. In contrast, in Embodiment 1, the largest optical axis deviation amount E of the lens units 11 is 1 μm. That is, the optical axis deviation amount E in Embodiment 1 can be reduced to half or less of that in Comparison Example.

Effects of Embodiments

As described above, the lens unit 11 of Embodiment 1 includes the first lens array 2 in which a plurality of lens elements 21 are arranged in the X direction, and the second lens array 4 in which a plurality of lens elements 41 facing the lens elements 21 are arranged in the X direction. The second lens array 4 is disposed at a position where the first lens array 2 is rotated about the virtual line T perpendicular to the arrangement direction (X direction) as the rotational axis by 180 degrees. Thus, the optical axis deviation can be reduced even when an error occurs in the arrangement interval PX between the lens elements 21 or the arrangement interval PX between the lens elements 41. Therefore, a resolution of the lens unit 11 can be enhanced, and a clear image can be formed.

The first lens array 2 and the second lens array 4 have the same shape as each other and thus can be constituted by molded bodies formed by the same mold. Thus, manufacturing cost can be reduced.

Since the virtual line T passes through the optical axis A1 of one lens element 21 in the first lens array 2, or through the intermediate position N between two lens elements 21 adjacent to each other in the X direction, the lens elements 21 and 41 can be made to face each other in a state where the second lens array 4 is rotated about the virtual line T as the rotational axis by 180 degrees.

The first lens array 2 and the second lens array 4 respectively have the bosses 23 and 43 (first positioning portions) at the substantially centers in the X direction. The light shielding plate 3 has the concave portions 34 and 36 (second positioning portions) to be engaged with the bosses 23 and 43. This arrangement can reduce the deviation between the optical axis of the lens element 21 and the optical axis of the lens element 41, and to reduce the deviation between each of the lens elements 21 and 41 and the corresponding opening 31, even when thermal expansion or thermal contraction occurs in the lens arrays 2 and 4.

The lens arrays 2 and 4 respectively have the protrusions (engaging portions) 28 and 48 on the sides of the lens arrays 2 and 4 facing the light shielding plate 3. The light shielding plate 3 has the holes (engaged portions) 38 and 39 with which the protrusions 28 and 48 are engaged. The hole 39 is disposed in the light shielding plate 3 so as to be engaged with the protrusion 48 in a state where the second lens array 4 is rotated relative to the first lens array 2 about the virtual line T as the rotational axis by 180 degrees. Thus, the second lens array 4 can be prevented from being mounted to the light shielding plate in the incorrect orientation.

Since the light shielding plate 3 has the guide portions 33 (first guide portions) that position the first lens array 2 in the Y direction and the guide portions 35 (second guide portions) that position the second lens array 4 in the Y direction, the lens elements 21 and 41 of the lens arrays 2 and 4 and the openings 31 of the light shielding plate 3 can be positioned with respect to one another.

Embodiment 2

Next, Embodiment 2 of the present invention will be described. In Embodiment 2, a range of the deviation ΔP (see FIGS. 11 and 12) of the arrangement interval of the lens elements 21 in the lens array 2 and the deviation ΔP of the arrangement interval of the lens elements 41 in the lens array 4 is determined in order to enhance the resolution.

Figure 14:
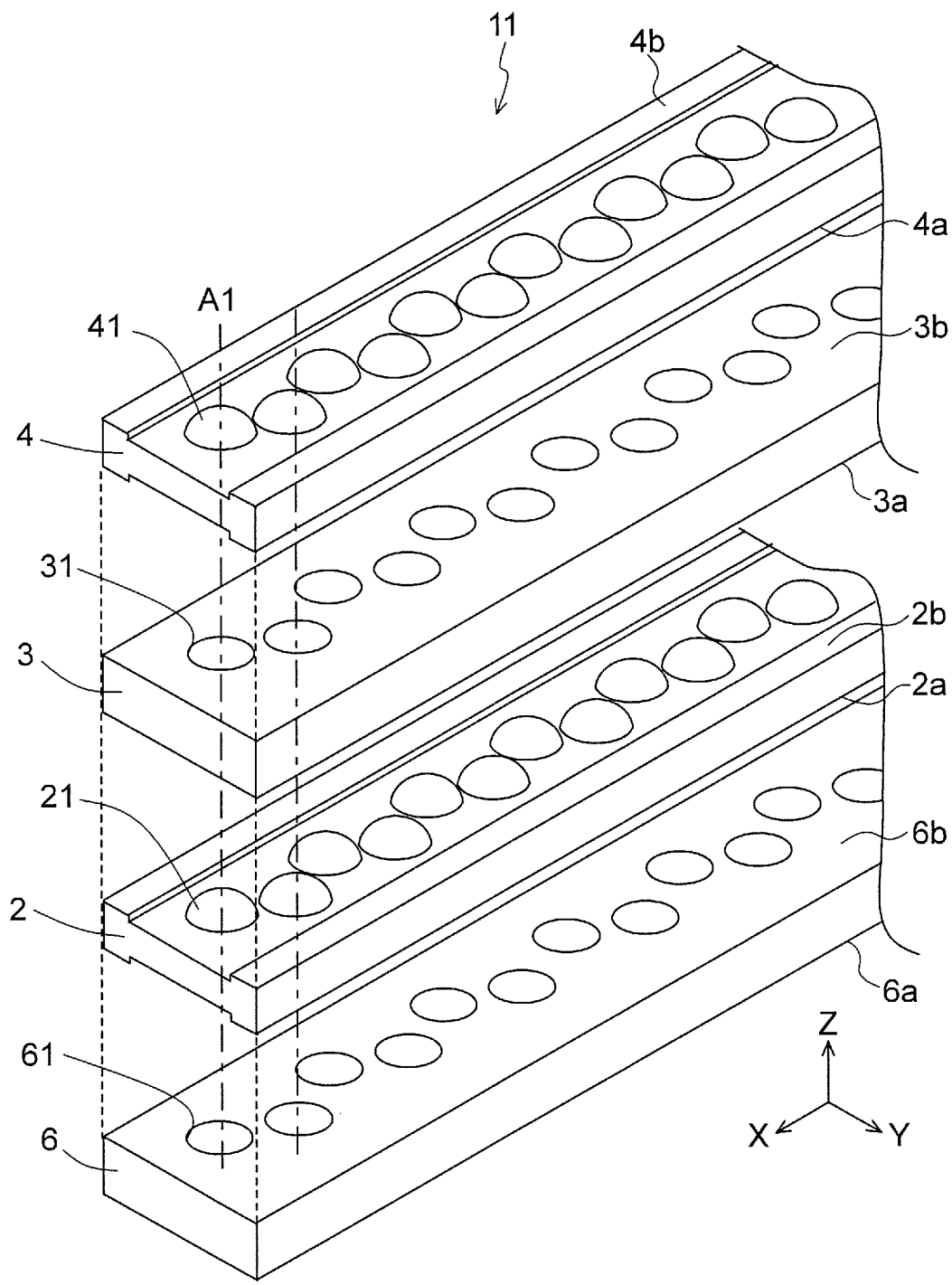
FIG. 14 is a schematic diagram showing a lens unit of Embodiment 2.

FIG. 14 is an exploded perspective view schematically showing a lens unit 11 of Embodiment 2. The lens unit 11 includes a mask 6 as a second light shielding member. The mask 6 is provided on the incident side of the first lens array 2. In this regard, it is also possible to provide the mask 6 on the above described lens unit 11 of Embodiment 1.

Figure 15:
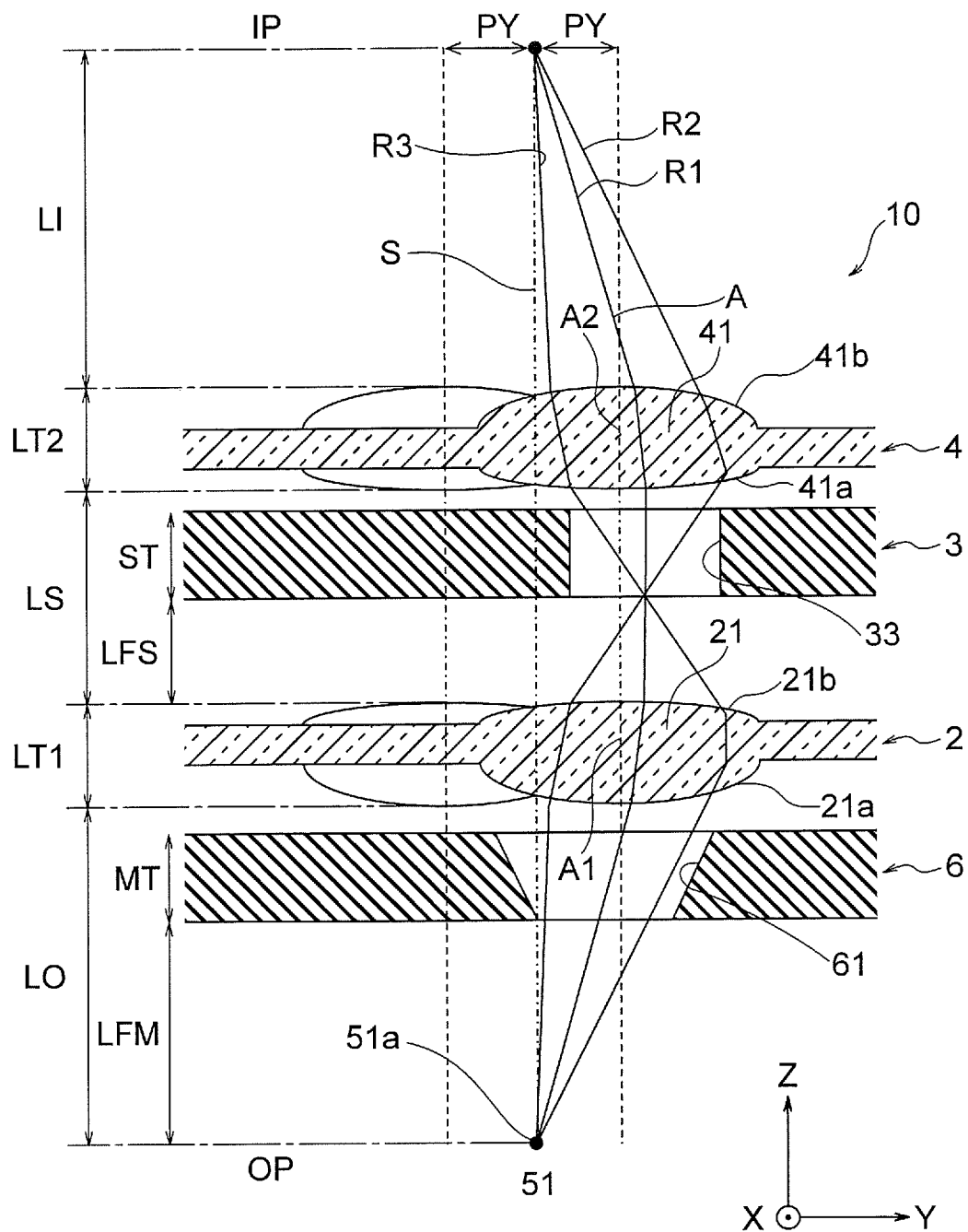
FIG. 15 is a diagram showing a function of the lens unit of Embodiment 2.

FIG. 15 is a diagram for explaining a function of the lens unit 11. As described in Embodiment 1, the optical axis A1 of the lens element 21 in the first lens array 2 is located substantially coaxially with the optical axis A2 of the lens element 41 in the second lens array 4. These optical axes A1 and A2 define the optical axis A of the lens unit 11.

The object plane OP of the lens unit 11 coincides with the LED 51a in the LED array chip 51 on the wiring board 5. The distance LO from the object plane OP to the lens element 21 in the first lens array 2, the thickness LT1 of the lens element 21 in the first lens array 2, the distance LS from the first lens array 2 to the second lens array 4, the thickness LT2 of the lens element 41 in the second lens array 4, and the distance LI from the lens element 41 in the second lens array 4 to the imaging plane IP are as described in Embodiment 1.

In this example, LFM represents a distance from the object plane OP to the mask 6 in the Z direction, and MT represents a thickness of the mask 6. LFS represents a distance between the first lens array 2 and the light shielding plate 3 in the Z direction, and ST represents a thickness of the light shielding plate 3.

Figure 16:
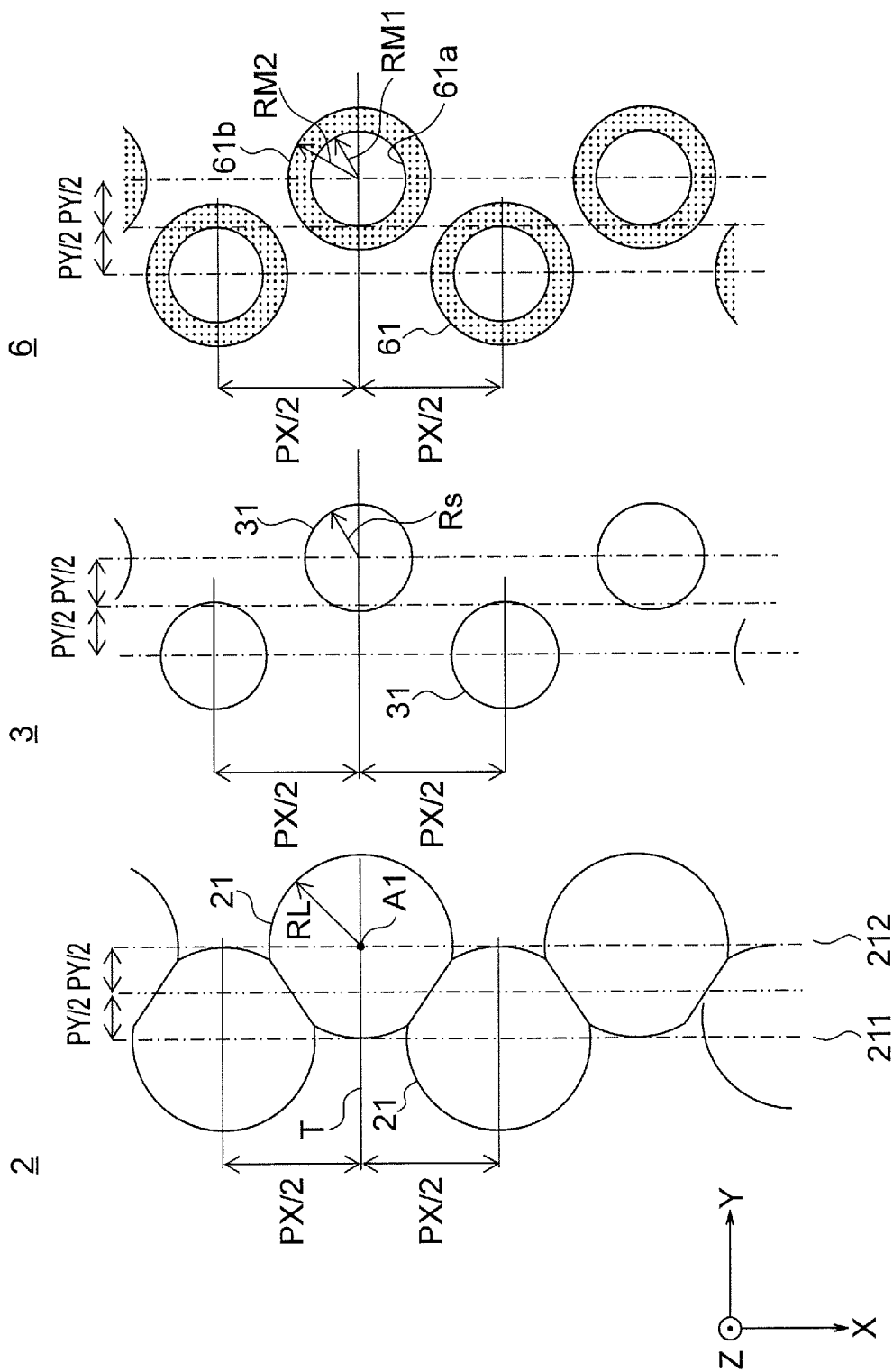
FIG. 16A is a diagram showing an arrangement of lens elements in each lens array of Embodiment 2.
FIG. 16B is a diagram showing an arrangement of openings in a light shielding member of Embodiment 2.
FIG. 16C is a diagram showing an arrangement of openings in a mask of Embodiment 2.

FIG. 16A is a plan view of the first lens array 2 as viewed from the +Z side (emission side). The lens elements 21 in the first lens array 2 are arranged in two rows (hereinafter referred to as the rows 211 and 212) in a staggered pattern. The lens elements 21 in each row are arranged at arrangement intervals PX in the X direction. RL represents a radius of the lens element 21, and PY represents an interval between the rows 211 and 212 in the Y direction.

The second lens array 4 is in a positional relationship relative to the first lens array 2 such that the second lens array 4 is rotated about the virtual line T in the Y direction that passes through the center in the X direction of the first lens array 2 as the rotational axis by 180 degrees.

FIG. 16B is a plan view of the light shielding plate 3 as viewed from the +Z side (emission side). The openings 31 of the light shielding plate 3 are arranged in two rows in a staggered pattern. The openings 31 in each row are arranged at the same arrangement intervals PX as the lens elements 21 in the X direction. RS represents a radius of the opening 31, and PY represents an interval between the two rows in the Y direction.

FIG. 16C is a plan view of the mask 6 as viewed from the +Z side (emission side). The openings 61 of the mask 6 are arranged in two rows in a staggered pattern. The openings 61 in each row are arranged at the same arrangement intervals PX as the lens elements 21 in the X direction. The radius of the opening 61 is RM1 on the incident side (on the −Z side), and is RM2 on the emission side (on the +Z side). The radius RM1 is smaller than the radius RM2. PY represents an interval between the two rows in the Y direction.

Figure 17:
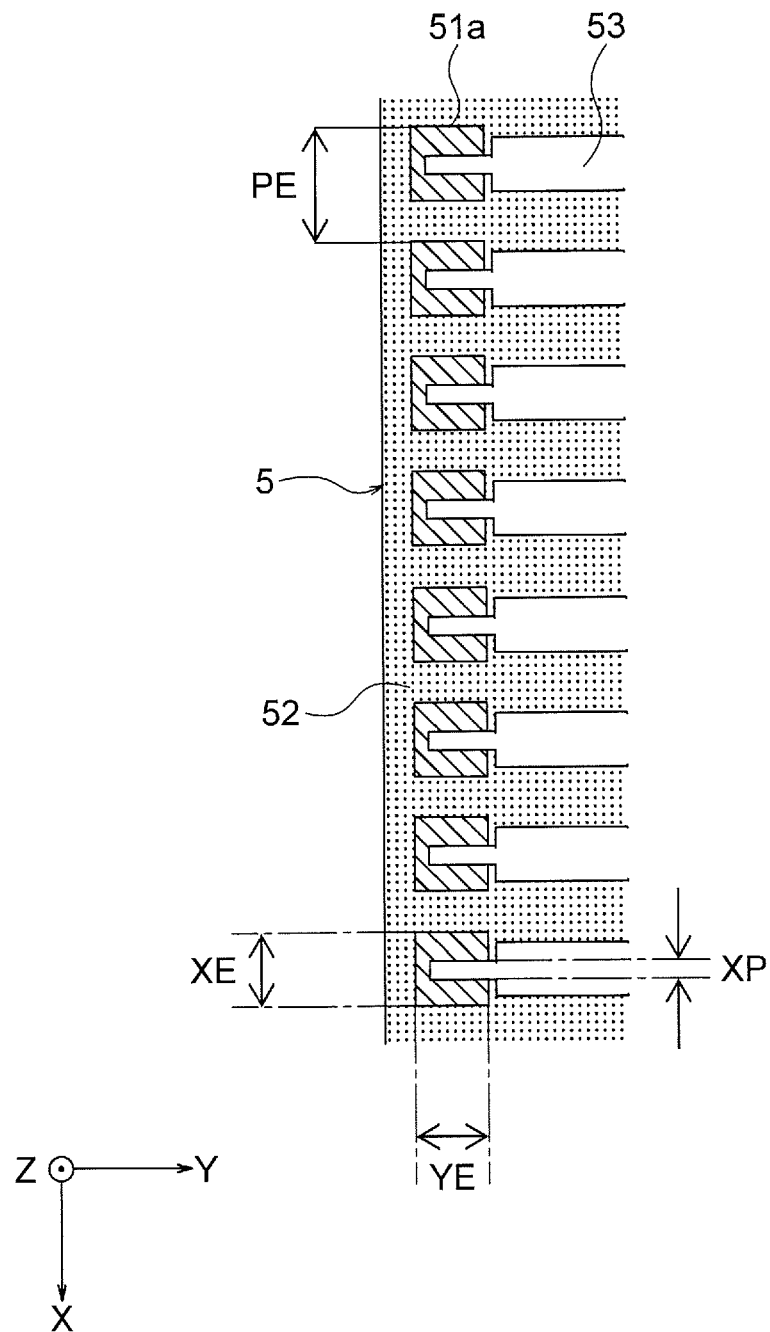
FIG. 17 is a diagram showing an arrangement of LEDs in Embodiment 2.

FIG. 17 is a diagram showing the arrangement of the LEDs 51a on the wiring board 5. As shown in FIG. 17, the LEDs 51a are arranged at arrangement intervals PE in the X direction. For the LED head 10 of 1200 dpi, the arrangement interval PE is 0.021 mm. The LED 51a has a length XE in the X direction and a length YE in the Y direction. In this example, the length XE and the length YE are both 0.010 mm.

Each LED 51a is connected to a wiring 53 of the drive circuit. The LED 51a has a connecting portion (i.e., an electrode portion) connected to the wiring 53. A width of the connecting portion in the X direction is represented by XP (<XE).

Next, specific numerical examples of Embodiment 2 will be described. Table 1 shows dimensions of each part of the lens arrays in Embodiment 2.

TABLE 1

| Optical Element | Item | Dimension [mm] |
|---|---|---|
| First Lens Array 2 | Thickness LT1 | 1.3 |
| | Surface Interval LS | 2.2 |
| | Arrangement Interval PX of Lens Elements 21 | 0.6 |
| | Arrangement Interval PY of Lens Elements 21 | 0.38 |
| | Radius RL1 of Lens Surface 21a | 0.6 |
| | Radius RL2 of Lens Surface 21b | 0.55 |
| Second Lens Array 4 | Thickness LT1 | 1.3 |
| | Surface Interval LS | 0.6 |
| | Arrangement Interval PX of Lens Elements 41 | 0.38 |
| | Arrangement Interval PY of Lens Elements 41 | 0.55 |
| | Radius RL1 of Lens Surface 41a | 0.6 |
| Mask 6 | Thickness MT | 1 |
| | Surface Interval LFM | 1.9 |
| | Radius RM1 | 0.35 |
| | Radius RM2 | 0.4 |
| Light Shielding Plate 3 | Thickness ST | 1.0 |
| | Surface Interval LFS | 1.1 |
| | Radius RS of Opening 12a | 0.4 |

Table 2 shows the shape of each lens surface. Each of the lens surfaces 21a and 21b of the lens element 21 in the first lens array 2 and the lens surfaces 41a and 41b of the lens element 41 in the second lens array 4 has a rotational aspherical shape, and is represented by a radius of curvature and fourth, sixth, and eight order aspherical coefficients.

TABLE 2

| Lens Surface | Item | Numeral Value [mm] |
|---|---|---|
| Lens Surface 21a | Radius of Curvature | 0.9504 |
| | 4th Order Aspherical Coefficient | −0.3626 |
| | 6th Order Aspherical Coefficient | 0.7646 |
| | 8th Order Aspherical Coefficient | −1.1253 |
| | Distance LO to Object Plane | 3.852 |
| | Distance to Mask 6 | 1.952 |
| Lens Surface 21b | Radius of Curvature | −0.9597 |
| | 4th Order Aspherical Coefficient | 0.3219 |
| | 6th Order Aspherical Coefficient | 0.3761 |
| | 8th Order Aspherical Coefficient | 0.1313 |
| | Distance LI from Image Plane | 1.657 |
| | Focal Length f | 1.166 |

The lens arrays 2 and 4 are made of, for example, a cycloolefin resin, as described in Embodiment 1. In this example, "APEL (trademark) APL5513TL" manufactured by Mitsui Chemicals Incorporated is used as an example of cycloolefin resins. A refractive index of this resin at 25° C. for light with a wavelength of 770 nm is 1.5373.

Each of the lens elements 21 and 41 in the lens arrays 2 and 4 has a focal length f of 1.166 mm and a back focal length of 0.614 mm. A distance from the lens surface 21a of the lens element 21 to a first principal plane is 0.552 mm. A distance from the lens surface 41b of the lens element 41 to a second principal plane is also 0.552 mm. The magnification m of each of the lens elements 21 and 41 is 3.

The light shielding plate 3 and the mask 6 are made of, for example, a polycarbonate. In this example, "YUPIRON (trademark) H-4000" manufactured by Mitsubishi Engineering Plastics Corporation is used as an example of polycarbonates.

Regarding the LED head 10, positions of the surface apexes of the lens elements 21 and 41 in the lens arrays 2 and 4 are measured, and then the deviation OP of the arrangement interval of the lens elements 21 and the deviation $\Delta P$ of the arrangement interval of the lens elements 41 (see FIGS. 11 and 12) is determined.

Further, the LEDs 51a in this LED head 10 are sequentially turned on, and the images of the LEDs 51a formed by the lens unit 11 are observed.

Further, a printing test is performed using the process unit 12K for black in a color LED printer as the image forming apparatus 1 (see FIG. 1) to which the LED head 10 is mounted. The resolution of the LED head 10 is 1200 dpi. An A4-sized standard sheet (paper) is used as the medium P. A printing environment is set at a temperature of 22° C. and a humidity of 50%.

Figure 18A:
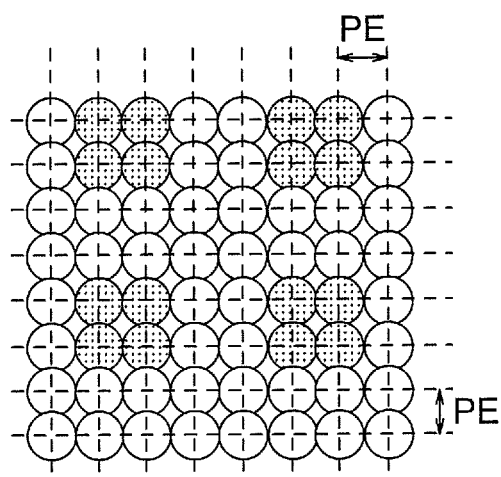
FIGS. 18A, 18B, and 18C are diagrams showing printing patterns used in a printing test.
Figure 18B:
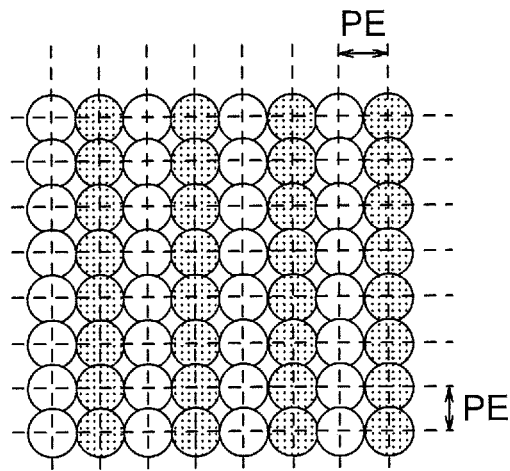
Figure 18C:
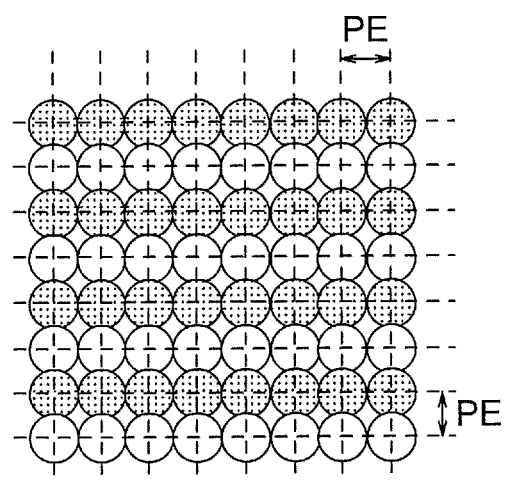

In the printing test, three types of patterns shown in FIGS. 18A, 18B, and 18C are printed. In FIGS. 18A to 18C, dots with dot hatching are formed by turning on the LEDs 51a, while white dots are formed by turning off the LEDs 51a.

The pattern shown in FIG. 18A is a pattern (2×2 pattern) in which matrices, each including four dots arranged in 2 rows and 2 columns, are arranged in a matrix at intervals of 2 dots in the X direction and 2 dots in the Y direction. The pattern shown in FIG. 18B is a pattern in which thin lines extending in the Y direction are arranged at intervals of 1 dot in the X direction. The pattern shown in FIG. 18C is a pattern in which thin lines extending in the X direction are arranged at intervals of 1 dot in the Y direction. These printed patterns are visually observed, and presence or absence of unevenness such as vertical streaks is observed.

The measurement results of the deviations $\Delta P$ between the arrangement interval of the lens elements 21 and the arrangement interval of the lens elements 41, the observation results of images of the LED 51a, and the observation results of the printed images obtained by the printing test are compared with each other.

As a result, when the deviation $\Delta P$ of the arrangement interval exceeds 3.3 μm, the image of the LED 51a separated (split) into two is observed, and vertical stripes (stripe-shaped unevenness) in the Y direction on the printed image is observed.

In contrast, when the deviation $\Delta P$ of the arrangement interval is less than 3.3 μm, the separation of the image of the LED 51a is not observed, and the vertical stripes on the printed image is not observed.

As can be seen from this result, in order to enhance the resolution to thereby form a clear image, it is desirable that the deviation $\Delta P$ of the arrangement interval of the lens elements 21 in the lens array 2 and the deviation $\Delta P$ of the arrangement interval of the lens elements 41 in the lens array 4 satisfy $0<\Delta P<3.3$ μm.

By using the magnification m (three times) of each of the lens elements 21 and 41 and the length XE (0.01 m) of the LED 51a in the X direction, the relationship of $0<\Delta P<3.3$ μm can be expressed as $0<\Delta P<XE/m$. Therefore, in order to enhance the resolution to thereby form a clear image, it is desirable that the deviation $\Delta P$ of the arrangement interval of the lens elements 21 and the deviation $\Delta P$ of the arrangement interval of the lens elements 41 satisfy $0<\Delta P<XE/m$.

As described above, in Embodiment 2, the resolution of the lens unit 11 can be further enhanced and a clearer image can be formed by setting the deviation $\Delta P$ of the arrangement interval of the lens elements 21 in the lens array 2 and the deviation $\Delta P$ of the arrangement interval of the lens elements 41 in the lens array 4 so as to satisfy $0<\Delta P<XE/m$ (or $0<\Delta P<3.3$ μm).

First Modification

Figure 19:
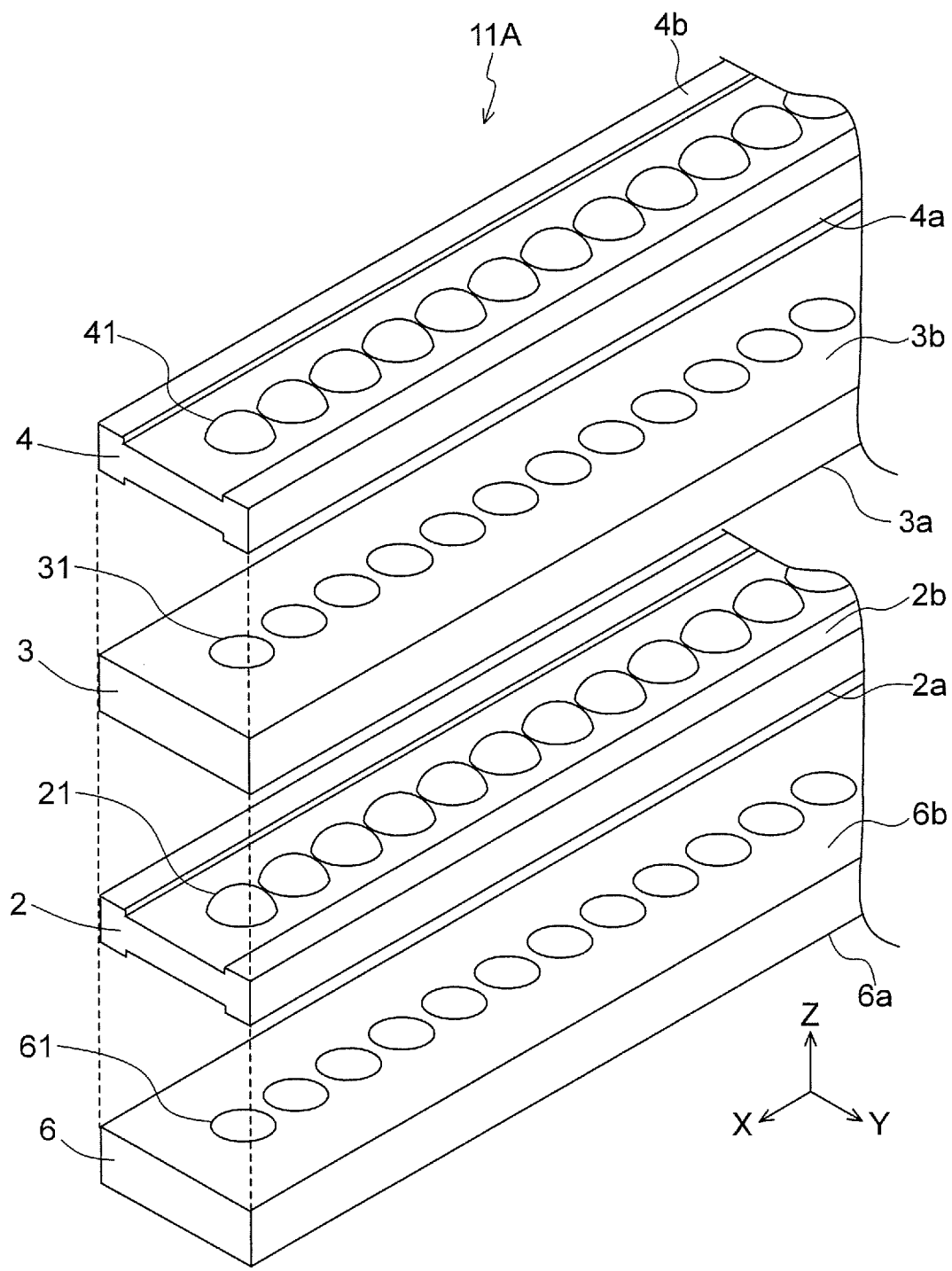
FIG. 19 is a perspective view showing a lens unit of Modification.

In each of the embodiments described above, the lens elements 21 in the lens array 2 are arranged in two rows, and the lens elements 41 in the lens array 4 are also arranged in two rows. However, the present disclosure is not limited to such a configuration. For example, as schematically shown in FIG. 19, the lens element 21 in the lens array 2 may be arranged in one row, and the lens element 41 in the lens array 4 may also be arranged in one row. In this case, the openings 31 of the light shielding plate 3 are arranged in one row, and the openings 61 of the mask 6 are also arranged in one row.

Further, the lens elements 21 and 41 in the lens arrays 2 and 4, the openings 31 of the light shielding plate 3, and the openings 61 of the mask 6 each may be arranged in three or more rows.

Second Modification

Figure 20:
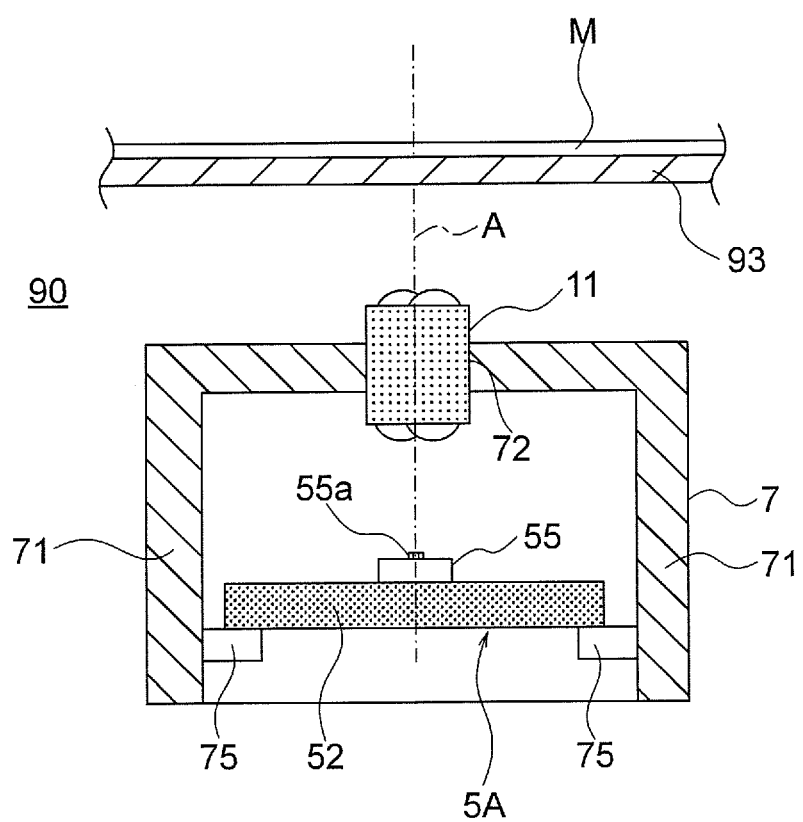
FIG. 20 is a sectional view showing a reading head to which the lens units of the Embodiments and Modification are applicable.

In each of the embodiments described above, the LED head 10 with the LEDs 51a as optical elements has been described. However, as shown in FIG. 20, a reading head 90 that has light receiving elements 55a as optical elements may be used. In this case, the length XE described in Embodiment 2 is a length of a light receiving element 55a in the X direction.

Figure 21:
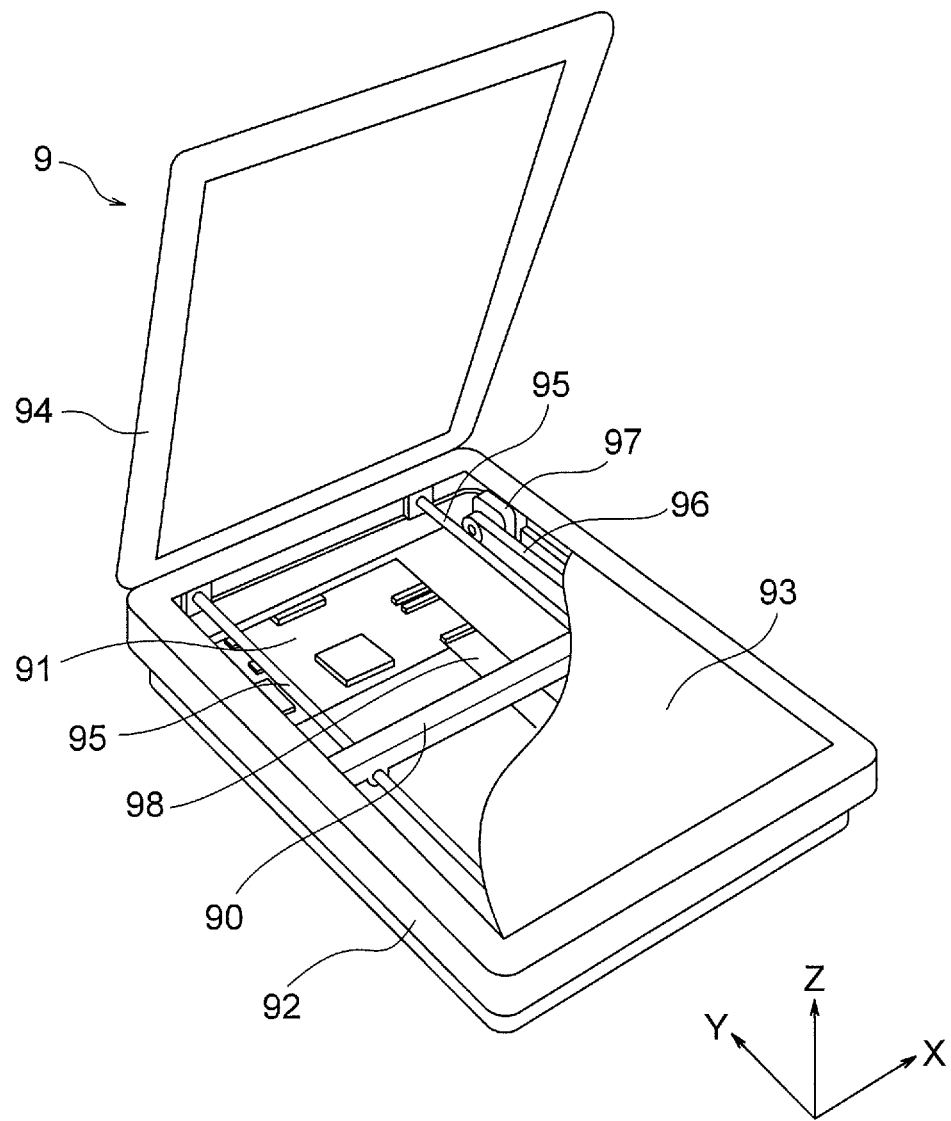
FIG. 21 is a perspective view showing an image reading apparatus including the reading head shown in FIG. 20.

FIG. 21 is a perspective view showing an image reading apparatus 9 that includes the reading head 90 shown in FIG. 20. The image reading apparatus 9 is, for example, a flatbed-type image scanner. The image reading apparatus 9 includes a housing 92, a document table (support table) 93 provided on an upper surface of the housing 92, the reading head 90 (contact image sensor head) arranged below the document table 93, and a cover 94 covering a top side of the document table 93. The document table 93 is made of material (such as glass) that transmits visible light. A document to be read (reading object) is placed on the surface of the document table 93.

The reading head 90 is obtained by replacing the LED array chip 51 (see FIG. 2) having the above described LEDs 51a with a light receiving element chip 55 having light receiving elements 55a. The reading head 90 is configured in a similar manner as the LED head 10, except that the LED array chip 51 is replaced with the light receiving element chip 55.

In order to guide the reading head 90 in the sub-scanning direction (Y direction), a pair of guides 95 are provided along the document table 93. The reading head 90 is coupled to a drive belt 96, and the drive belt 96 is coupled to a stepping motor 97. The reading head 90 is connected to a control circuit 91 via a flexible flat cable 98.

A basic operation of the image reading apparatus 9 is as follows. When the document to be read is placed on the document table 93 and a switch (such as a scan button) is pressed, a light source (not shown) mounted to the reading head 90 is turned on to emit light to irradiate the document. The reading head 90 takes in the light reflected at a surface of the document while moving in the Y direction through the drive belt 96 driven by the stepping motor 97. The reading head 90 converts the received optical signal into an electrical signal.

Since the reading head 90 has the lens unit 11 described in each of the embodiments and the modification, an image of the document can be formed on the light receiving element 55*a* satisfactorily, and a reading resolution can be enhanced.

Instead of moving the reading head 90 as described above, it is also possible to convey the document using an automatic document feeder (ADF) so as to pass through a predetermined reading position on the document table 93, and to read the image of the document using the reading head 90 that stays at the reading position.

In the above described embodiments and modification, a color printer (see FIG. 1) has been described as an example of the image forming apparatus. However, the image forming apparatus of the present disclosure is not limited to the color printer, and may be, for example, a monochrome printer. Further, the image forming apparatus of the present disclosure is not limited to a printer, and may be, for example, a copier, a facsimile machine, a multifunction peripheral, or the like.

Although the preferred embodiments of the present invention have been specifically described above, the present invention is not limited to the above described embodiments, and various modifications and changes can be made to these embodiments without departing from the scope of the present invention.

What is claimed is:

1. A lens unit comprising:
   a first lens array including a plurality of first lens elements each of which has a first optical axis, the first lens elements being arranged in an arrangement direction perpendicular to the first optical axis; and
   a second lens array including a plurality of second lens elements facing the first lens elements, each of the second lens elements having a second optical axis, the second lens elements being arranged in the arrangement direction, and
   a light shielding member disposed between the first lens array and the second lens array, the light shielding member including a plurality of openings arranged in the arrangement direction,
   wherein the second lens array is in a positional relationship relative to the first lens array such that the second lens array is rotated about a virtual line perpendicular to both the first optical axis and the arrangement direction as a rotational axis by 180 degrees,
   wherein the first optical axis of the first lens element located at a substantially center of the first lens array in the arrangement direction and the second optical axis of the second lens element located at a substantially center of the second lens array in the arrangement direction are arranged to substantially coincide with each other,
   wherein the first lens array includes a first positioning portion located at the substantially center in the arrangement direction, and the second lens array includes a second positioning portion located at the substantially center in the arrangement direction,
   wherein the light shielding member includes a first fitting portion into which the first positioning portion is fitted and a second fitting portion into which the second positioning portion is fitted, and
   wherein the first positioning portion and the second positioning portion are respectively fitted into the first fitting portion and the second fitting portion so that the first positioning portion and the second positioning portion face each other in a direction of the first optical axis via the light shielding member.

2. The lens unit according to claim 1, wherein the virtual line is located at the substantially center of the first lens array in the arrangement direction.

3. The lens unit according to claim 1, wherein the virtual line is located to pass through the first optical axis of one of the first lens elements in the first lens array or through an intermediate portion between two first lens elements in the first lens array adjacent to each other in the arrangement direction.

4. The lens unit according to claim 1, wherein the first lens array includes a first engaging portion on a side facing the light shielding member, and the second lens array includes a second engaging portion on a side facing the light shielding member,
   wherein the light shielding member includes a first engaged portion with which the first engaging portion engages and a second engaged portion with which the second engaging portion engages, and
   wherein the second engaged portion of the light shielding portion is formed to be engaged with the second engaging portion on a condition that:
   the second lens array is in a positional relationship relative to the first lens array such that the second lens array is rotated about the virtual line as the rotational axis by 180 degrees, and
   the first optical axis of the first lens element located at the substantially center of the first lens array and the second optical axis of the second lens element located at the substantially center of the second lens array are arranged to substantially coincide with each other.

5. The lens unit according to claim 4, wherein the first engaged portion and the second engaged portion are formed on opposite sides to each other with respect to the center of the light shielding member in the arrangement direction.

6. The lens unit according to claim 1, wherein the light shielding member includes a first guide portion configured to position the first lens array in a direction of the rotational axis and a second guide portion configured to position the second lens array in the direction of the rotational axis.

7. The lens unit according to claim 1, wherein the first lens array and the second lens array have the same shape as each other.

8. The lens unit according to claim 7, wherein the first lens elements in the first lens array are arranged in two rows, and
   wherein the second lens elements in the second lens array are arranged in two rows.

9. The lens unit according to claim 1, wherein each of the first lens array and the second lens array is integrally formed of resin.

10. The lens unit according to claim 9, wherein the substantially center of the first lens array in the arrangement direction corresponds to a position of a gate of a mold for forming the first lens array, and the substantially center of the second lens array in the arrangement direction corresponds to a position of a gate of a mold for forming the second lens array.

11. The lens unit according to claim 1, wherein the first lens array and the second lens array are arranged in such a manner that the first optical axis of each of the plurality of first lens elements and the second optical axis of each of the plurality of second lens elements substantially coincide with each other.

12. The lens unit according to claim 1, wherein the lens unit collects light from a plurality of optical elements or collects light onto the plurality of optical elements,
   wherein m represents a magnification of the first lens element,
   wherein XE represents a size of the optical element in the arrangement direction,
   wherein $\Delta P$ represents a deviation of an arrangement interval of the first lens elements in the arrangement direction, and
   wherein $\Delta P$ is in the following range:
   $0<\Delta P<XE/m$.

13. The lens unit according to claim 12, wherein $\Delta P$ is in the following range:
   $0<\Delta P<3.3$.

14. An exposure device comprising:
the lens unit according to claim 1, and
a light emitting element disposed to face the lens unit.

15. An image forming apparatus comprising:
the exposure device according to claim 14;
an image bearing body disposed to face the exposure device;
a developing portion configured to develop a latent image formed by the exposure device on the image bearing body; and
a transfer portion configured to transfer the image developed by the developing portion to a medium.

16. A reading head comprising:
the lens unit according to claim 1; and
a light receiving element disposed to face the lens unit.

17. An image reading apparatus comprising:
the reading head according to claim 16; and
a support table configured to hold a reading object at a position at which the reading object faces the reading head.

* * * * *